(12) United States Patent
Lee

(10) Patent No.: US 10,845,411 B2
(45) Date of Patent: Nov. 24, 2020

(54) TRANSMISSION LINE

(71) Applicant: TeraView Limited, Cambridge, Cambridgeshire (GB)

(72) Inventor: Ka Chung Lee, Cambridge (GB)

(73) Assignee: TeraView Limited, Cambridge (GB)

( * ) Notice: Subject to any disclaimer, the term of this patent is extended or adjusted under 35 U.S.C. 154(b) by 0 days.

(21) Appl. No.: 16/072,057

(22) PCT Filed: Jan. 27, 2017

(86) PCT No.: PCT/GB2017/050222
§ 371 (c)(1),
(2) Date: Jul. 23, 2018

(87) PCT Pub. No.: WO2017/129999
PCT Pub. Date: Aug. 3, 2017

(65) Prior Publication Data
US 2019/0072609 A1    Mar. 7, 2019

(30) Foreign Application Priority Data

Jan. 29, 2016 (GB) .................................. 1601692.5

(51) Int. Cl.
*G01R 1/067* (2006.01)
*G01R 31/00* (2006.01)
(Continued)

(52) U.S. Cl.
CPC ......... *G01R 31/308* (2013.01); *G01R 1/0416* (2013.01); *G01R 1/067* (2013.01);
(Continued)

(58) Field of Classification Search
CPC .. G01R 1/06772; G01R 1/06711; G01R 3/00; G01R 31/2889; G01R 1/0416; G01R 1/06788; G01R 1/067; G01R 1/06722
See application file for complete search history.

(56) References Cited

U.S. PATENT DOCUMENTS

| 4,513,266 A | 4/1985 | Ishihara |
| 4,745,361 A | 5/1988 | Nees et al. |

(Continued)

FOREIGN PATENT DOCUMENTS

| DE | 202 05 941 U1 | 7/2002 |
| EP | 1 251 580 A1 | 10/2002 |

(Continued)

OTHER PUBLICATIONS

KR 20150089820 Machine Translation, Aug. 5, 2015 (Year: 2015).*

(Continued)

*Primary Examiner* — Raul J Rios Russo
(74) *Attorney, Agent, or Firm* — Blank Rome LLP

(57) ABSTRACT

A transmission line arrangement having a first end and a second end, the transmission line arrangement being configured to transmit a signal between the first end and the second end, the transmission line arrangement comprising a signal conductor extending between the first end and the second end of the transmission line arrangement, a first conducting sheet and a second conducting sheet positioned on two opposing sides of the signal conductor, an insulating material separating the first and second conducting sheets from the signal conductor and a plurality of pieces of conducting material extending between the first and second conducting sheets and arranged at different positions between the first and second ends of the transmission line arrangement, wherein the pieces of conducting material and the conducting sheets are arranged to substantially surround the signal conductor for at least part of its length between the first and second ends of the transmission line arrangement.

20 Claims, 11 Drawing Sheets

(51) Int. Cl.
*G01R 31/308* (2006.01)
*H01P 3/06* (2006.01)
*H01P 5/02* (2006.01)
*H05K 1/02* (2006.01)
*G01R 3/00* (2006.01)
*H01P 3/08* (2006.01)
*G01R 31/28* (2006.01)
*G01R 1/04* (2006.01)

(52) U.S. Cl.
CPC ...... *G01R 1/06711* (2013.01); *G01R 1/06722* (2013.01); *G01R 1/06772* (2013.01); *G01R 1/06788* (2013.01); *G01R 3/00* (2013.01); *G01R 31/2889* (2013.01); *H01P 3/06* (2013.01); *H01P 3/085* (2013.01); *H01P 5/026* (2013.01); *H05K 1/025* (2013.01); *H05K 1/0219* (2013.01); *H05K 2201/09727* (2013.01)

(56) References Cited

U.S. PATENT DOCUMENTS

| | | | |
|---|---|---|---|
| 5,142,224 A | | 8/1992 | Smith et al. |
| 5,675,299 A | | 10/1997 | Suski |
| 6,118,287 A | | 9/2000 | Boll et al. |
| 2001/0010270 A1 | | 8/2001 | Lin et al. |
| 2003/0188889 A1 | | 10/2003 | Straub et al. |
| 2007/0279151 A1 | * | 12/2007 | Miller ...................... H01P 9/00 333/164 |
| 2008/0309358 A1 | * | 12/2008 | Strid .................. G01R 1/06711 324/762.05 |
| 2008/0315977 A1 | | 12/2008 | Green et al. |
| 2010/0102903 A1 | * | 4/2010 | Velayudham Karikalan ............... H05K 1/0219 333/238 |
| 2013/0112464 A1 | * | 5/2013 | Karikalan ............ H05K 1/0219 174/257 |
| 2013/0313013 A1 | | 11/2013 | Porta et al. |
| 2014/0021963 A1 | | 1/2014 | Cole |
| 2015/0070104 A1 | * | 3/2015 | Dedic ..................... H01P 1/227 333/32 |
| 2017/0084975 A1 | * | 3/2017 | Baba ......................... H01P 3/08 |
| 2017/0153274 A1 | | 6/2017 | Neuhauser |

FOREIGN PATENT DOCUMENTS

| | | |
|---|---|---|
| JP | H08-233879 A | 9/1996 |
| KR | 10-2015-0089820 A | 8/2015 |
| WO | WO 98/54586 A1 | 12/1998 |
| WO | WO 2010/020443 A1 | 2/2010 |
| WO | WO 2015/149893 A1 | 10/2015 |

OTHER PUBLICATIONS

Young-Gon Kim et al., "A New Design Method for Ultrawideband Microstrip-to-Suspended Stripline Transitions", International Journal of Antennas and Propagation, vol. 2013, pp. 1-9.

* cited by examiner

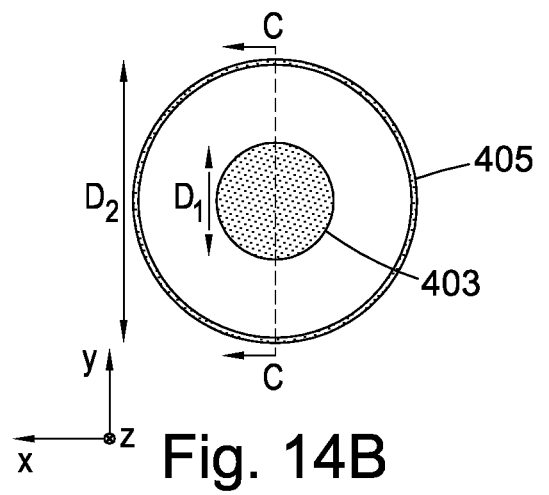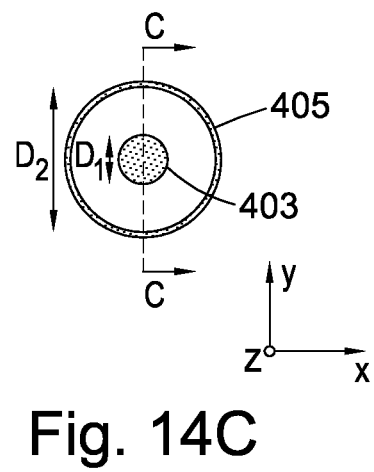
Fig. 14B    Fig. 14C
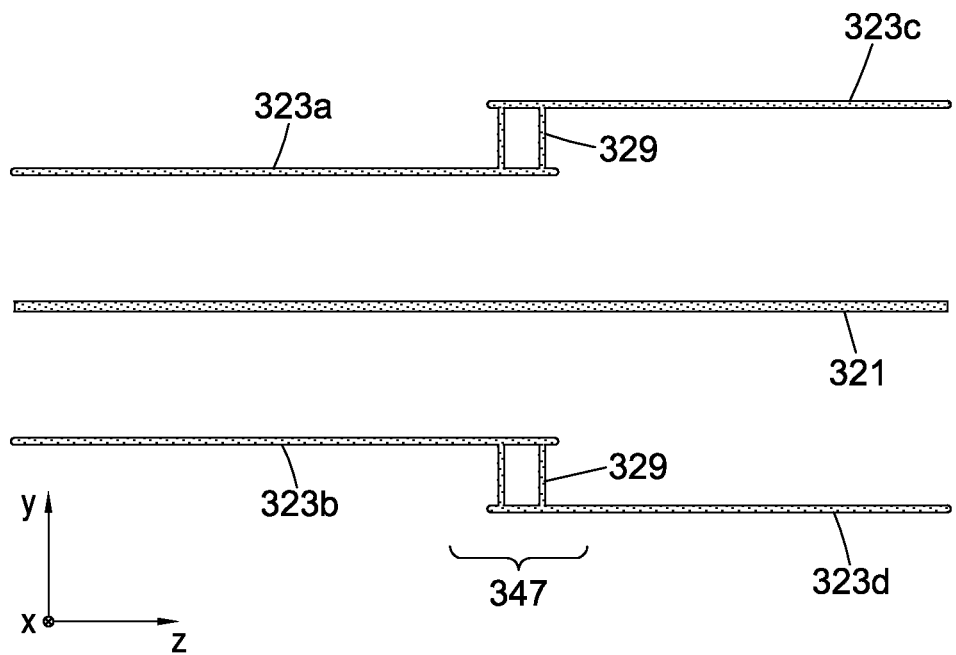
Fig. 15A
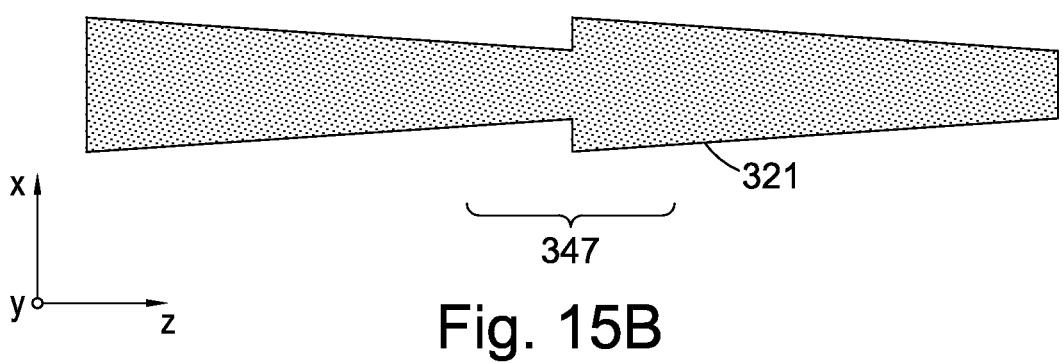
Fig. 15B

TRANSMISSION LINE

FIELD

The present invention relates to a transmission line and a method of designing a transmission line. The present invention may find particular use in a probe for use in testing the integrity of an electronic device.

BACKGROUND

An electronic device to be tested may, for example, comprise a semiconductor device (e.g. an integrated circuit). After manufacture of an electronic device it is desirable to test the device. For example, the integrity of one or more circuits in the electronic device may be tested.

Methods of testing an electronic device may, for example, comprise inputting an electronic signal (e.g. a pulsed signal) into the device and measuring any reflections of the signal from the device. If the device includes any breaks or short circuits in its circuits then a signal which is input to the device will be at least partially reflected. If no defects are present in the device than little or none of the input signal will be reflected from the device. Measurement of reflected signals from a device under test (DUT) may therefore be used to test the integrity of the device and detect any faults in the device. Additionally or alternatively measurement of signals which are transmitted through a device may be used to test the integrity of the device and detect any faults in the device.

Signals may be input into a device via a probe which is brought into contact with one or more electrical contacts on the device. Signals which are reflected from or transmitted by the device under test may also be transmitted through the probe and provided to a test apparatus.

It is an object of the present invention to provide an improved transmission line which obviates or mitigates one or more problems of the prior art, whether identified herein or otherwise. The transmission line may be used in a probe.

SUMMARY OF THE INVENTION

According to a first aspect of the invention there is provided a transmission line arrangement having a first end and a second end, the transmission line arrangement being configured to transmit a signal between the first end and the second end, the transmission line arrangement comprising: a signal conductor extending between the first end and the second end of the transmission line arrangement; a first conducting sheet and a second conducting sheet positioned on two opposing sides of the signal conductor; an insulating material separating the first and second conducting sheets from the signal conductor; and a plurality of pieces of conducting material extending between the first and second conducting sheets and arranged at different positions between the first and second ends of the transmission line arrangement, wherein the pieces of conducting material and the conducting sheets are arranged to substantially surround the signal conductor for at least part of its length between the first and second ends of the transmission line arrangement.

The plurality of pieces of conducting material which extend between the conducting sheets serve to substantially surround the signal conductor with conducting material. This reduces any radiation of energy out of the sides of the transmission line arrangement and between the conducting sheets. This advantageously reduces any loss and/or dispersion of signal pulses which are transmitted along the signal conductor.

At least some of the plurality of pieces of conducting material are arranged at different positions between the first and second ends. That is, at least some of the different pieces of conducting material are situated at different distances from an end of the transmission line arrangement (e.g. the first end).

The conducting sheets and the pieces of conducting material extending between the sheets together form a ground conductor. The conducting sheets may be referred to as ground planes. The first conducting sheet may be formed substantially in a first plane. The second conducting sheet may be formed substantially in a second plane. The first and second planes may be substantially parallel to each other. The pieces of conducting material may extend in a direction which is substantially perpendicular to a plane in which the first or second conducting sheet is substantially situated. In other embodiments one or both of the first and second conducting sheets may not be flat and may not therefore be formed substantially in first and second planes.

The signal conductor may, for example, comprise a strip of conducting material. The strip of conducting material may extend through the insulating material and may be surrounded by and in contact with the insulating material. The signal conductor may transmit a signal current along the transmission line arrangement.

Adjacent pieces of conducting material may be separated from each other. Consequently portions of the length of the signal conductor may not be entirely surrounded by the conducting sheets and the pieces of conducting material. For some portions of the length of the signal conductor, pieces of conducting material may only be positioned on one side of the signal conductor.

The plurality of pieces of conducting material and/or the conducting sheets may not extend along the entire length of the signal conductor. For example, the transmission line arrangement may include one or more portions of its length at which one or both of the conducting sheets are not present. Additionally or alternatively the transmission line arrangement may include one or more portions of its length at which pieces of conducting material are only positioned to one side of the signal conductor. Additionally or alternatively the transmission line arrangement may include one or more portions of its length at which no pieces of conducting material are present. One or more portions of the transmission line arrangement at which one or both of the conducting sheets is not present or at which pieces of conducting material are only positioned to one side of the signal conductor or at which no pieces of conducting material are present may, for example, be positioned towards an end of the transmission line arrangement (i.e. near to the first or second end of the probe).

References herein to the signal conductor being substantially surrounded by pieces of conducting material and conducting sheets is intended to refer to the signal conductor being surrounded in two-dimensions. That is, in a cross-section taken through the transmission line arrangement the pieces of conducting material and the conducting sheets together substantially encompass the signal conductor. References herein to the signal conductor being substantially surrounded is not intended to mean that the signal conductor is surrounded from all directions (i.e. surrounded in three dimensions).

The transmission line arrangement may further comprise a conductor extending between at least two of the plurality of pieces of conducting material, wherein the conductor intersects the pieces of conducting material in between the first and second conducting sheets.

The pieces of conducting material may act as an antenna and may serve to absorb radiation at a resonant frequency of the antenna. This may prevent signal components at or near to the resonant frequency of the antenna from being transmitted along the transmission line arrangement. If a signal to be transmitted along the transmission line arrangement includes frequency components at or near to the resonant frequency of the antennas formed by the pieces of conducting material, components of the signal will be attenuated by the antennas. The resonant frequency of an antenna is dependent on the length of the antenna. In general, the resonant frequency of an antenna increases with decreasing length of the antenna.

The conductor which intersects the pieces of conducting material in between the first and second conducting sheets serves to effectively shorten the antennas formed by the conducting material. Shortening the antennas increases their resonant frequency and therefore increases the frequency at which signal components will be attenuated by the antennas. The resonant frequency may be increased until it lies outside a range of interest. The range of interest may comprise the range of frequencies at which a signal to be transmitted along the transmission line has substantial components.

For example, signals to be transmitted along the transmission line may include frequency components in the range 0.01 GHz to 10 THz. The conductor may serve to increase the resonant frequency of the antennas to a frequency which is greater than about 10 THz at which the signal to be transmitted does not have any substantial components. In other embodiments the signal to be transmitted may be restricted to only include substantial components in the range of approximately 0.25 GHz-200 GHz. The conductor may serve to increase the resonant frequency of the antennas to a frequency which is greater than about 200 GHz at which the signal to be transmitted does not have any substantial components. In other embodiments the conductor may serve to increase the resonant frequency of the antennas to a frequency which is greater than about 150 GHz.

The transmission line may comprise a plurality of conductors, each conductor extending between at least two of the pieces of conducting material and intersecting the pieces of conducting material in between the first and second conducting sheets, wherein different conductors intersect the pieces of conducting material at different distances from the first conducting sheet.

A plurality of conductors intersecting the pieces of conducting material at different distances from the first conducting sheets further divides the pieces of conducting material up into a larger number of antennas, each antenna having a shorter length. This may further increase the resonant frequency of the antennas and thus further increase the frequencies which may be attenuated by the effect of the antennas.

The plurality of pieces of conducting material may comprise a first group of pieces of conducting material positioned on a first side of the signal conductor and a second group of pieces of conducting material positioned on a second side of the signal conductor, the second side being substantially opposite the first side.

The transmission line arrangement may comprise a first conductor extending between pieces of conducting material of the first group of pieces of conducting material and a second conductor extending between pieces of conducting material of the second group of pieces of conducting material.

The first group of pieces of conducting material and/or the second group of pieces of conducting material may be arranged substantially in a line.

The line of pieces of conducting material may extend substantially parallel to a direction in which the signal conductor extends.

The first and second sheets may lie substantially in first and second planes, the first and second planes both being substantially perpendicular to a direction in which the plurality of pieces of conducting material extend.

The transmission line arrangement may further comprise a plurality of holes in the insulating material and extending between the first and second conducting sheets, wherein at least some of the plurality of pieces of conducting material are situated in at least some of the plurality of holes.

The insides of the holes may be coated with the conducting material. Such an arrangement may be referred to as plated through holes. In other embodiments a conducting material may not coat the insides of a hole but may merely be situated inside the hole. In some embodiments the holes may be completely filled with conducting material. In other embodiments, only a portion of the space defined by the holes may be occupied by conducting material.

The transmission line arrangement may be formed on a printed circuit board.

Forming the transmission line arrangement on a printed circuit board (PCB) significantly reduces the costs of manufacturing the probe, when compared to other transmission line arrangements. Furthermore, PCB manufacturing techniques can be used to easily manufacture transmission line arrangements of different types and dimensions. A transmission line arrangement may therefore be customised for a given use of the transmission line arrangement. A transmission line arrangement may, for example, be designed for connection to a given apparatus. For example the cross-sectional shape of the transmission line arrangement and/or the characteristic impedance of the transmission line arrangement may be matched at one or both ends to the cross-sectional shape and/or the characteristic impedance of a device to be tested or a connection apparatus. Once a customised transmission line arrangement has been designed, PCB manufacturing techniques may be used to manufacture the customised probe.

According to a second aspect of the invention there is provided a probe suitable for use in testing a device, the probe comprising: a first end adapted for connection to a device under test; a second end adapted for connection to a test apparatus; and a transmission line arrangement according to the first aspect, wherein the transmission line arrangement is configured to transmit a signal between the first end of the probe and the second end of the probe.

According to a third aspect of the invention there is provided a probe suitable for use in testing a device, the probe comprising: a first end adapted for connection to a device under test; a second end adapted for connection to a test apparatus; and a transmission line arrangement extending at least part of the way between the first and second ends of the probe, wherein the transmission line arrangement has a first characteristic impedance at a first end of the transmission line arrangement and a second characteristic impedance at a second end of the transmission line arrangement, wherein the second characteristic impedance is different to the first characteristic impedance, the transmission line arrangement comprising: a signal conductor configured to transmit a signal current between the first and second ends of the transmission line arrangement, wherein a cross-sectional shape of the signal conductor changes between the first and the second ends of the transmission line arrangement; and a ground conductor configured to transmit a ground current between the first and second ends of the transmission line arrangement, wherein a cross-sectional shape of the ground conductor changes between the first and second ends of the transmission line arrangement.

It may be desirable for the transmission line arrangements to have different cross-sectional shapes at its first and second ends. For example, the transmission line arrangement at its first end may be substantially matched to an electrical connection on a device to be tested and/or a probe end to be brought into contact with the device. The transmission line arrangement at its second end may be matched to a connection for connecting to a test apparatus. Matching of the transmission line arrangements may, for example, include matching the cross-sectional shape of the transmission line arrangements and/or the characteristic impedance of the transmission line arrangements. A mismatch of the impedance and/or the cross-sectional shape of the transmission line arrangement with an element to which the transmission line is connected (e.g. an electrical contact on a device under test) will result in signal reflections from the interface between the transmission line and the element. Reflections from an interface may interfere with measurements of signal which is reflected from components within a device under test. It is therefore desirable to configure the ends of the transmission line arrangement for connection to different elements so as to reduce reflections at interfaces with the elements to which the transmission line arrangement is attached.

In some embodiments a cross-sectional dimension of both the ground and signal conductor may both increase or decrease with increasing distance from the first end of the transmission line arrangement.

In some embodiments a cross-sectional dimension of both the ground and signal conductor may both increase with increasing distance from the first end of the transmission line arrangement. The cross-sectional dimension of the ground conductor may be greater at the second end of the transmission line arrangement than at the first end of the transmission line arrangement. The cross-sectional dimension of the signal conductor may be greater at the second end of the transmission line arrangement than at the first end of the transmission line arrangement.

In other embodiments a cross-sectional dimension of both the ground and signal conductor may decrease with increasing distance from the first end of the transmission line arrangement. The cross-sectional dimension of the ground conductor may be greater at the first end of the transmission line arrangement than at the second end of the transmission line arrangement. The cross-sectional dimension of the signal conductor may be greater at the first end of the transmission line arrangement than at the second end of the transmission line arrangement.

References herein to a transmission line arrangement are not intended to include components such as, for example, probe ends and connectors which are adapted for connection to one or more elements to which the probe is to be connected. References herein to a transmission line arrangement are instead intended to refer to the arrangement of a signal conductor and a ground conductor which extend at least part of the way between the first and second ends of a probe. For example, a transmission line arrangement may only be considered to include portions of conductors which are situated in or in contact with an insulating material. Components such as probe ends, which may extend out of an insulating material are not considered to form part of the transmission line arrangement of a probe. In embodiments in which the transmission line arrangement is formed on a printed circuit board (PCB). The transmission line arrangement may only be considered to include portions of the conductors which are formed on the PCB.

The cross-sectional shape of the signal and ground conductors at the first end of the transmission line arrangement may be configured such that the first characteristic impedance is substantially matched to the characteristic impedance of the device under test.

The cross-sectional shapes of the signal and ground conductors at the second end of the transmission line arrangement may be configured such that the second characteristic impedance is substantially matched to the characteristic impedance of the test apparatus.

The cross-sectional shapes of the signal and ground conductors at the first end of the transmission line arrangement may be configured such that a cross-sectional shape of the transmission line arrangement is substantially matched to the cross-sectional shape of at least one electrical contact of the device under test.

The cross-sectional shapes of the signal and ground conductors at the second end of the transmission line arrangement may be configured such that a cross-sectional shape of the transmission line arrangement is substantially matched to the cross-sectional shape of a connection of the test apparatus.

The transmission line arrangement may include at least one transition region in which the cross-sectional shapes of the signal and/or the ground conductor vary with distance from the first end of the probe.

A transition region may be configured to transition the cross-sectional shape of the transition line arrangement without providing any sharp interfaces in the transmission line arrangement from which large signal reflections may occur. For example, the shape of one or more elements of the transmission line arrangement may be gradually tapered such that the arrangement does not include any discontinuities in shape and/or characteristic impedance from which signal may be reflected.

The transition region may be configured such that changes in the characteristic impedance of the transmission line arrangement with changing distance from the first end of the probe are substantially continuous.

The transition region may be configured such that changes in the cross-sectional shape of the transmission line arrangement with changing distance from the first end of the probe are substantially continuous.

The ground conductor may substantially surround the signal conductor for at least part of its length between the first and second ends of the probe, the ground conductor being separated from the signal conductor by an insulating material.

The ground conductor may have a first cross-sectional dimension and wherein the signal conductor has a second cross-sectional dimension and wherein the probe includes at least one transition region in which both the first dimension and the second dimension increase or decrease at substantially the same distance from the first end of the probe.

The probe may include a transition region, proximate the first end of the probe, in which the ground conductor transitions from substantially surrounding the signal conductor to not surrounding the signal conductor at the first end of the probe.

A cross-sectional dimension of the signal conductor may increase with decreasing distance from the first end of the probe, in the transition region.

The signal conductor and the ground conductor may be formed in an insulating material, and wherein the signal and ground conductor are separated from each other by portions of the insulating material.

For at least a portion of the length of the probe between the first and second ends, the ground conductor may comprise: a first conducting sheet and a second conducting sheet positioned on two opposing sides of the signal conductor and separated from the signal conductor by portions of the insulating material; and a plurality of pieces of conducting material extending between the first and second conducting sheets and arranged at different positions between the first and second ends, wherein the pieces of conducting material are separated from the signal conductor by portions of the insulating material and wherein the pieces of conducting material and the sheets are arranged to substantially surround the signal conductor.

The probe may include a transition region in which a width of the first conducting sheet decreases with decreasing distance to the first end of the probe.

The transition region may include at least a portion in which the pieces of conducting material are only positioned on one side of the signal conductor.

The transition region may include at least a portion which does not include the first conducting sheet.

The transition region may include at least a portion in which a third conducting sheet is situated adjacent to the signal conductor and wherein the third conducting sheet and the signal conductor are situated substantially in the same plane.

The transition region may include at least a portion in which a fourth conducting sheet is positioned substantially parallel with the third conducting sheet.

The transition region may include at least a portion in which a plurality of pieces of conducting material extend between the third conducting sheet and the fourth conducting sheet.

The plurality of pieces of conducting material extending between the third and fourth conducting sheets may only be situated on a single side of the signal conductor.

At least a portion of the transmission line arrangement may be a transmission line arrangement according the first aspect.

The transmission line arrangement may be formed on a printed circuit board.

According to a fourth aspect of the invention there is provided a test system for testing a device, the test system comprising: a source of pulsed radiation configured to provide a generating radiation beam and a receiving radiation beam, wherein the generating and receiving radiation beams are pulsed radiation beams; a first signal conversion device arranged to receive a pulse of the generating radiation beam and configured to output a signal pulse in response to receiving a pulse of the generating radiation beam; a second signal conversion device arranged to receive a pulse of the receiving radiation beam and configured to sample a signal pulse in response to receiving a pulse of the receiving radiation beam; and a probe according to the second or third aspect, the probe being configured to transmit a signal pulse from the first signal conversion device to the device under test and configured to transmit a signal pulse reflected from or transmitted by the device under test to the second signal conversion device.

The first signal conversion device may be configured to generate an electrical signal based upon an optical signal. The first signal conversion device may, for example, comprise a photoconductive element. Alternatively the first signal conversion device may comprise an electro-optic device.

The second signal conversion device may be configured to generate an electrical signal based upon an optical signal. The second signal conversion device may, for example, comprise a photoconductive element. Alternatively the second signal conversion device may comprise an electro-optic device.

The source of pulsed radiation may comprise a single radiation source or may comprise separate radiation sources for illuminating the first signal conversion device and the second signal conversion device. For example, the source of pulsed radiation may comprise a first laser configured to illuminate the first signal conversion device and a second laser configured to illuminate the second signal conversion device.

An optical delay may be introduced between pulses of the generating radiation beam and pulses of the receiving radiation beam. The optical delay allows reflections and/or transmissions from the device under test to be measured at a given delay time. The optical delay may be adjusted (e.g. using an adjustable delay line) in order to measure reflections and/or transmission from the device under test to be measured at different delay times.

According to a fifth aspect of the invention there is provided method of designing a probe for testing a device, the probe comprising a first end adapted for connection to a device under test, a second end adapted for connection to a test apparatus and a transmission line arrangement configured to transmit a signal between the first end and the second end, the method comprising: determining a geometry and characteristic impedance of at least one electrical contact on a device to which the first end of the probe is to be connected; selecting a first geometry of the transmission line arrangement at a first end of the probe, the first geometry being selected according to the determined geometry and characteristic impedance of the at least one electrical contact on the device to be tested; determining a geometry and characteristic impedance of a connection on the test apparatus to which the second end of the probe is to be connected; selecting a second geometry of the transmission line arrangement at the second end of the probe, the second geometry being selected according to the determined geometry and characteristic impedance of the connection on the test apparatus; selecting, from a library of transitions, one or more transition region arrangements, the transition region arrangements comprising a transition in the geometry of the transition line arrangement between two different cross-sectional shapes, wherein the one or more selected transition region arrangements together serve to transition the cross-sectional shape of the transmission line arrangement between the selected first geometry at the first end of the probe and the selected second geometry at the second end of the probe.

Determining a geometry and characteristic impedance of at least one electrical contact on a device to be tested may comprise obtaining design data related to the device under test.

Determining a geometry and characteristic impedance of at least one electrical contact on a device to be tested may comprise measuring the geometry of the at least one electrical contact.

Determining a geometry and characteristic impedance of at least one electrical contact on a device to be tested may comprise measuring the characteristic impedance of the at least one electrical contact.

Measuring the characteristic impedance of the at least one electrical contact may comprise connecting a test apparatus to the at least one electrical connection via a probe having a known characteristic impedance.

The method of may further comprise transmitting a signal pulse into the at least one electrical contact via the probe and measuring signal reflected from or transmitted through the device under test.

The library of transitions may comprise transition region arrangements comprising a ground conductor and a signal conductor.

The ground conductor and the signal conductor may be separated from each other by portions of an insulating material.

At least a portion of the ground conductor may comprise a plurality of holes formed in the insulating material, wherein the insides of the holes include a conducting material.

At least a portion of the ground conductor may comprise a first conducting sheet and a second conducting sheet.

At least some of the plurality of holes may extend between the first conducting sheet and the second conducting sheet thereby providing a conducting pathway between the first and second conducting sheets.

The library of transitions may comprise transition region arrangements formed in a printed circuit board.

According to a sixth aspect of the invention there is provided a method of manufacturing a probe, the method comprising: designing a probe according to the method of the fifth aspect; and manufacturing a probe according to the design of the probe.

Features of different aspects of the invention may be combined with features of other aspects of the invention.

BRIEF DESCRIPTION OF THE DRAWINGS

Embodiments of the invention will now be described, by way of example, only with reference to the accompanying schematic drawings in which:

FIGS. 14A-14C are schematic illustrations of a transmission line arrangement which may form part of an embodiment of the invention;

FIGS. 15A and 15B are schematic illustrations of a portion of a transmission line arrangement which may form part of an embodiment of the invention.

DETAILED DESCRIPTION

Figure 1:
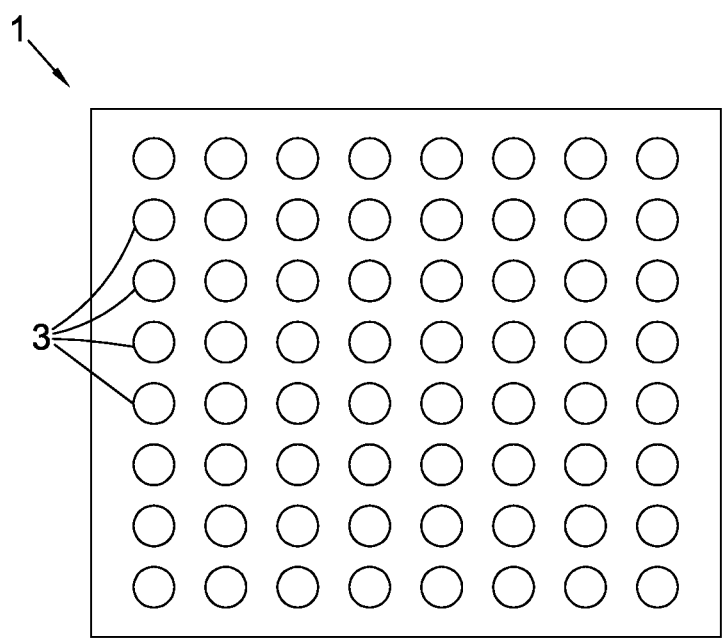
FIG. 1 is a schematic illustration of an electronic device for testing.

FIG. 1 is a schematic illustration of an electronic device 1 which may be tested using a test apparatus which may be connected to the device via a probe (not shown in FIG. 1). The electronic device 1 may be referred to as a device under test (DUT). The DUT 1 comprises a plurality of electrical contacts 3. The plurality of electrical contacts 3 may, for example, comprise a ball-grid array (BGA), a land-grid array (LGA) or a pin-grid array (PGA). The DUT may be tested by making simultaneous electrical contact between at least two of the electrical contacts 3 and a probe.

Figure 2:
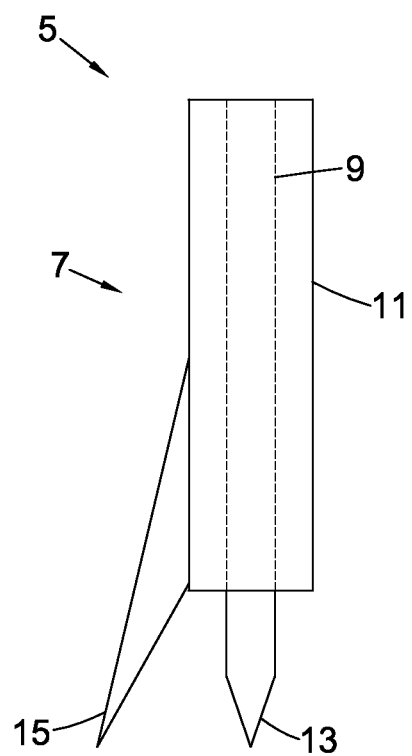
FIG. 2 is a schematic illustration of a probe which may be used to establish electrical contact with the electronic device of FIG. 1.

FIG. 2 is a schematic illustration of a probe 5 according to the prior art. The probe 5 may be used to establish electrical contact with electrical contacts 3 of a DUT 1. The probe 5 comprises a coaxial cable section 7 which terminates in a first probe end 13 and second probe end 15. The coaxial cable section 7 comprises an inner conductor 9 surrounded by an outer conductor 11, which are arranged in a coaxial transmission line configuration (the dotted line used to illustrate the inner conductor 9 indicates that the inner conductor 9 is encased by the outer conductor 11). The inner conductor 9 is electrically isolated from the outer conductor 11. Towards the end of the probe 5, the inner conductor 9 extends out of the outer conductor 11 and tapers to form the first probe end 13. The second probe end 15 is formed of a fin which extends out of the outer conductor 11 and which is electrically coupled to the outer conductor 11.

In order to test a DUT 1, the first probe end 13 may be contacted with a first electrical contact 3 on the DUT 1 and the second probe end 15 may be contacted with a second electrical contact 3 on the DUT 1. The inner conductor 9 and the first probe end 13 may be used to input a signal into the DUT 1 and may therefore be considered to carry a signal current. The second probe end 15 and the outer conductor 11 may be used to conduct a ground current.

In some embodiments, a probe may comprise more than two probe ends. For example, a probe may comprise three probe ends. A probe comprising three probe ends may comprise one probe end which conducts a live current and two probe ends which each conduct a ground current. Such a configuration may be referred to as a ground-signal-ground probe configuration.

Figures 3A, 3B:
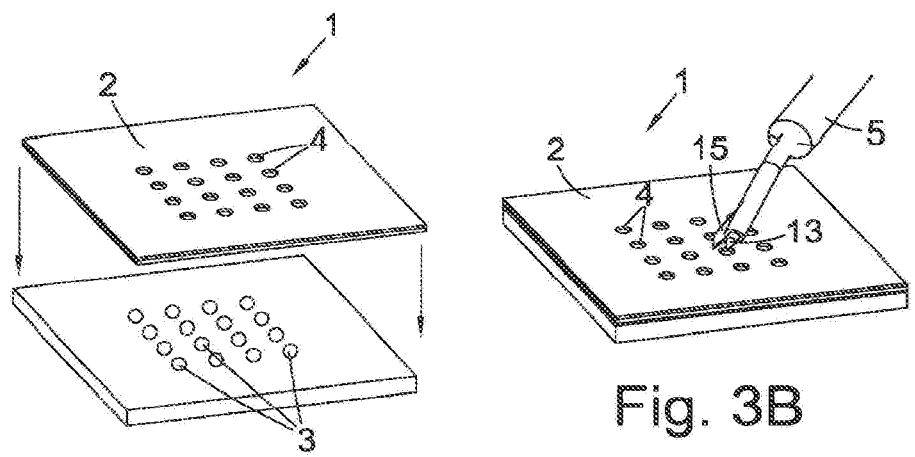
FIGS. 3A and 3B are schematic illustrations of an electronic device which includes a ground plate.

In some embodiments a DUT 1 may be provided with a ground plate to which a connection to ground may be made. FIGS. 3A and 3B are schematic illustrations of a DUT 1 which includes a ground plate 2. FIG. 3A shows the ground plate 2 separated from the rest of the DUT 1 and FIG. 3B shows the ground plate 2 in contact with the rest of the DUT

1. The ground plate 2 includes openings 4 through which electrical contacts 3 may be accessed.

A ground plate 2 may comprise a laminate structure. For example, the ground plate 2 may comprise a conducting upper layer and an insulating lower layer. The conducting upper layer may, for example, comprise gold-plated copper. The insulating lower layer may, for example, comprise a polymer (e.g. Polytetrafluoroethylene (PTFE)). The lower insulating layer acts to prevent electrical contact between the contacts 3 and the conducting upper layer.

As shown in FIG. 3B a DUT 1 may be tested by bringing a first probe end 13 of a probe 5 into contact with an electrical contact 3 and a second probe end 15 into contact with the ground plate 2. A ground plate 2 may be a separate element to a device to be tested and may only be placed onto the device in order to test the device. For example, a ground plate 2 may be placed onto a device in order to test an electrical contact which does not have a suitable adjacent contact to which a second probe end may be connected.

Whilst a ground plate may be a separate element to a device to be tested, for the purposes of this description a ground plate 2 placed on a device is considered to form part of the device under test 1. Furthermore the ground plate 2 is considered to be an example of an electrical contact of a DUT 1 to which a probe end 13, 15 may be contacted. Any reference herein to contacting an electrical contact 3 on a DUT 1 is intended to include contacting a ground plate 2 placed on a device.

Figure 4:
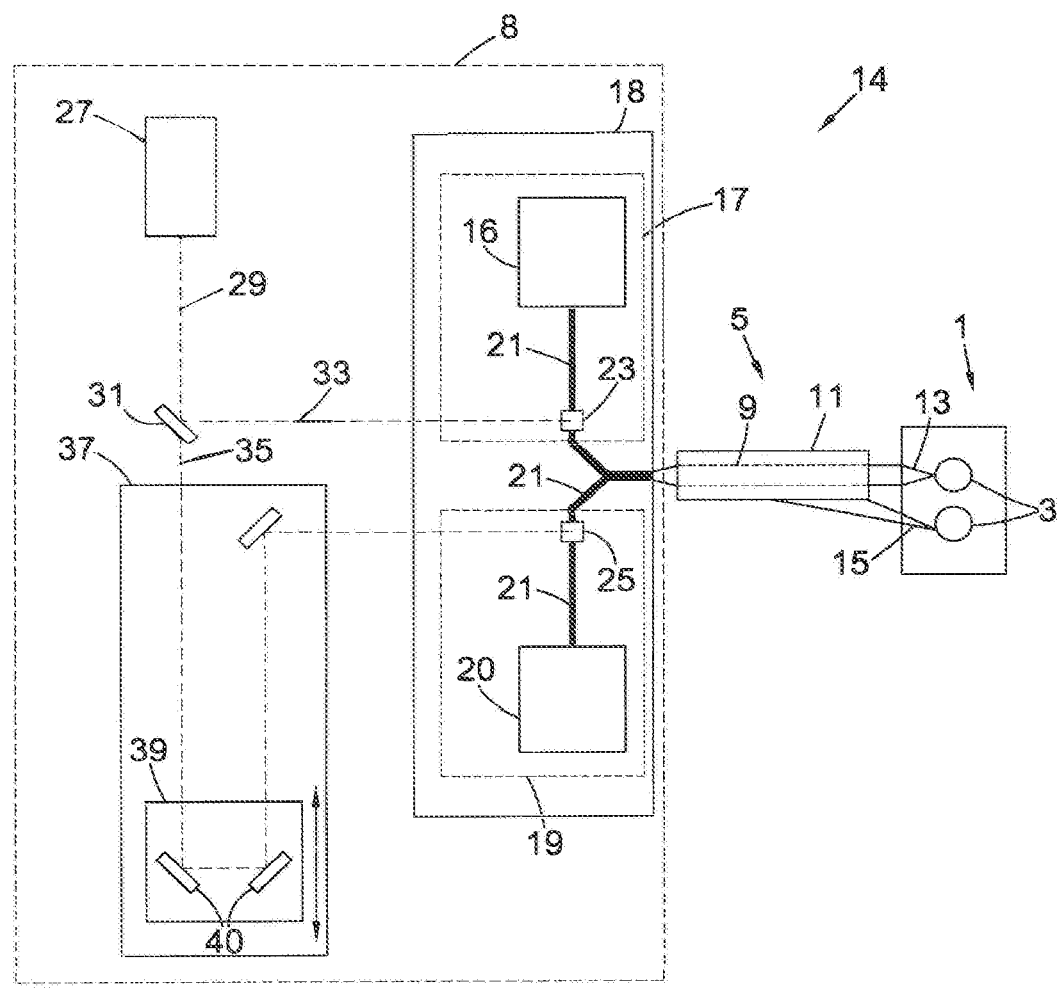
FIG. 4 is a schematic illustration of a portion of an embodiment of a test system.

FIG. 4 is a schematic illustration of a portion of a test system 15 which may be used to test a device under test 1. The test system comprises a test apparatus 8 and a probe 5. The probe 5 transmits signals between the test apparatus 8 and the DUT 1. The test apparatus 8 comprises a signal generator 17 and a signal sampler 19. The signal generator 17 may, for example, generate a broadband signal having frequency components in the range 0.01 GHz to 10 THz. In some embodiment a generated broadband signal may have frequency components at less than 0.01 GHz. A generated broadband signal may in general include frequency components in the range 0-10 THz. In some embodiments, the signal generator may generate a broadband signal having frequency components in the range 0.25 GHz to 200 GHz. A broadband signal may not necessarily have frequency components across an entire range specified herein but may merely have frequency components which occupy a small region of a range specified herein. For example, a broadband signal which has frequency components in a range of approximately 0.25 GHz-200 GHz (but for example does not have substantial frequency components at frequencies greater than about 200 GHz) is considered to be an example of a broadband signal having frequency components in the range 0.01 GHz to 10 THz.

The signal generator 17 generates signals for inputting into a DUT 1. The signal sampler 19 receives and analyses signals which are reflected from the DUT 1. Both the signal generator 17 and the signal sampler 19 are connected to a probe 5 via transmission lines 21. The probe 5 which is shown in FIG. 4, is similar to the probe 5 which was described above with reference to FIG. 2 and will not be described in any more detail with reference to FIG. 4. Like reference numerals in FIGS. 2 and 4 denote like features of the probe 5.

A first probe end 13 of the probe 5 is connected to a first electrical contact 3 on the DUT 1. The second probe end 15 is connected to a second electrical contact 3 on the DUT 1. For ease of illustration only two electrical contacts 3 are shown on the DUT 1 in FIG. 4. However, it will be appreciated that the DUT 1 may comprise more than two electrical contacts 3.

The inner conductor 9 of the probe 5, which is electrically connected to the first probe end 13, is connected to the transmission lines 21 which transmit signals from the signal generator 17 and to the signal sampler 19. Signals generated by the signal generator 17 may therefore be transmitted through the transmission lines 21, the inner conductor 9 of the probe 5, the first probe end 13 and into an electrical contact 3 of the DUT 1. Signal which is reflected in the DUT 1 may be transmitted through the first probe end 13, the inner conductor 9 of the probe 5, the transmission lines 21 and to the signal sampler 19 for analysis.

The signal generator 17 includes a biasing element 16 and a first photoconductive element 23. The signal sampler 19 includes a measurement device 20 and a second photoconductive element 25. The first and second photoconductive elements are electrically conductive in response to illumination by radiation and are not substantially electrically conductive when they are not illuminated with radiation. The first and second photoconductive elements 23, 25 may be selectively illuminated with radiation in order to generate signals at the first photoconductive element 23 and sample signals at the second photoconductive element 25. The signal generator 17 and the signal sampler 19 may be considered to form a sampling module 18 operable to input signal pulses into a DUT 1 through a probe 5 and receive signal reflections from the DUT 1.

The test system 14 further comprises a radiation source 27. The radiation source 27 emits pulses of radiation in the form of a pulsed radiation beam 29. The radiation source 27 may, for example, comprise a laser. The radiation beam is incident on a beam splitter 31 which splits the pulsed radiation beam 29 into a generating beam 33 comprising generating pulses and a receiving beam 35 comprising receiving pulses. The generating beam 33 is directed to be incident on the first photoconductive element 23 and the receiving beam 35 is directed to be incident on the second photoconductive element 25.

The pulsed generating beam 33 causes pulses of signal to be generated at the first photoconductive element 23 and input into the DUT 1. The biasing element 16 applies a potential to the first photoconductive element 23. For example, the biasing element 16 may apply a DC potential or an AC potential (e.g. having a frequency of approximately 30 KHz) to the first photoconductive element 23. When a pulse of radiation is incident on the first photoconductive element 23 a signal pulse is generated at the first photoconductive element 23 due to the combination of the biasing element 16 and the illumination of the first photoconductive element 23. The first photoconductive element therefore acts to generate an electrical signal based upon an optical signal.

The pulsed receiving beam 35 acts to sample electronic signals received at the second photoconductive element 25 at select times (when the second photoconductive element 25 receives a pulse of radiation). The signal which is sampled at the second photoconductive element 25 is measured by the measurement device 20. The second photoconductive element 25 may be considered to generate an electrical signal (which is measured by the measuring device 20) based upon an optical signal (provided by the receiving beam 35). The electrical signal generated at the second photoconductive element 25 is also based upon a signal which is reflected from the DUT 1. This process may be referred to as sampling a signal.

The optical path of the receiving beam 35 to the second photoconductive element 25 includes a delay line 37 configured to introduce an optical delay between a generating pulse of the generating beam 33 and a receiving pulse of the receiving beam 35. The optical delay which is introduced by the delay line 37 causes a generating pulse to be incident on the first photoconductive element 23 at a different time to a corresponding receiving pulse being incident on the second photoconductive element 25. Consequently there is a delay between a signal pulse being sent to the DUT 1 (from the signal generator 17) and a reflected signal being sampled by the second photoconductive element 22 and received by the measurement device 20.

The delay time between the input signal pulses and reflections being sampled by the signal sampler 19 may be adjusted in order to analyse reflections from the DUT 1 at different delay times after a pulse is input to the DUT 1. The delay line 37 includes a moveable stage 39 on which reflectors 40 in the optical path of the receiving beam 35 are mounted. Movement of the moveable stage 39 (as indicated by the double-headed arrow in FIG. 4) changes the optical path length of the receiving beam 35 and therefore changes the optical delay between a generating pulse 33 being incident on the first photoconductive element 23 and a receiving pulse being incident on the second photoconductive element 25. The moveable stage 39 may, for example, be scanned, in order to analyse reflections from the DUT 1, at different delay times.

It should be appreciated that the components which are shown in FIG. 4 are not shown to scale. The test system 14 may comprise different components to those depicted in FIG. 4 and described above and/or may comprise additional components to those described and depicted. Details of other embodiments of a test system are given in US20140021963 which is incorporated herein by reference in its entirety. Any of the features which are disclosed in US20140021963 may be used in conjunction with a test system described herein.

As was described above, the first photoconductive element 23 and the second photoconductive element 25 generate electrical signals based upon optical signals. The first and second photoconductive elements 23, 25 may be considered to be examples of signal conversion devices. In some embodiments a signal conversion device other than a photoconductive element may be used. For example, the first and/or second photoconductive elements 23, 25 may be replaced by other forms of signal conversion device.

An alternative signal conversion device which may form part of an embodiment of the invention may be an electro-optic device such as an electro-optic crystal. An electro-optic crystal which forms part of a signal generator may be configured to receive a polarised radiation beam (e.g. the generating beam 33) and generate an electrical signal based upon the polarised radiation beam.

An electro-optic crystal which forms part of a signal sampler may be configured such that an optical property of the crystal changes in response to being subjected to an electric field. For example, the birefringence of the crystal may change in response to being subjected to an electric field. An electrical signal which is incident on an electro-optic crystal from a DUT 1 subjects the crystal to an electric field. The receiving beam 35 may be directed to be incident on the electro-optic crystal and the receiving beam 35 which is transmitted by the crystal may be detected by one or more sensors. A change in an optical property of the crystal (e.g. the birefringence) induces a change in the receiving beam 35 which is transmitted by the crystal and may be detected by the one or more sensors. For example, a signal from a DUT 1 may serve to alter the polarisation state and/or amplitude of a receiving beam 35 which is transmitted by the crystal. A change in polarisation state and/or amplitude may, for example, be measured, for example, using polarising optics and one or more photodiode sensors. This may result in a measurement signal which is proportional to a signal received from a DUT 1.

Similarly to the operation of the photoconductive elements described above, electro-optic crystals may be used in conjunction with pulsed generating and receiving beams 33, 35 to generate signal pulses and sample reflected signals at select times. An optical delay may be introduced between the generating and receiving beams 33, 35 so as to allow reflections received at different delay times to be analysed (as was described above with reference to embodiments including photoconductive elements).

In some embodiments different forms of signal conversion devices may be used in a signal generator 17 and a signal sampler 19. For example, a photoconductive element may be used in a signal generator 17 and an electro-optic crystal may be used in a signal sampler 19.

Whilst embodiments have been described above in which a radiation beam 29 is emitted from a radiation source 27 and split into generating and receiving beams 33, 35, in some embodiments separate radiation sources may be used to generate the generating and receiving beams. For example, in some embodiments a dual laser system comprising two synchronised lasers may be used. The lasers may be synchronised in a controllable manner such that an optical delay between radiation beams emitted from the two lasers may be controlled and adjusted (e.g. electronically). In such embodiments, the synchronisation between the lasers may be adjusted in order to analyse signals received at different delay times (as was described above with reference to the delay line 37). Embodiments which include a dual laser system may not therefore include a delay line, since the function of a delay line may be replaced by adjusting a synchronisation between lasers. However, in some embodiments a delay line may still be used in conjunction with a dual laser system.

In embodiments which include more than one radiation source (e.g. a dual laser system) the plurality of radiation sources may be considered to together form a source of pulsed radiation. References herein to a source of pulsed radiation are intended to include a single radiation source or a plurality of radiation sources, such as a dual laser system. In embodiments in which a source of pulsed radiation comprises a single radiation source, the source of pulsed radiation may further comprise a beam splitter configured to split a radiation beam into a generating radiation beam and a receiving radiation beam.

Figure 5:
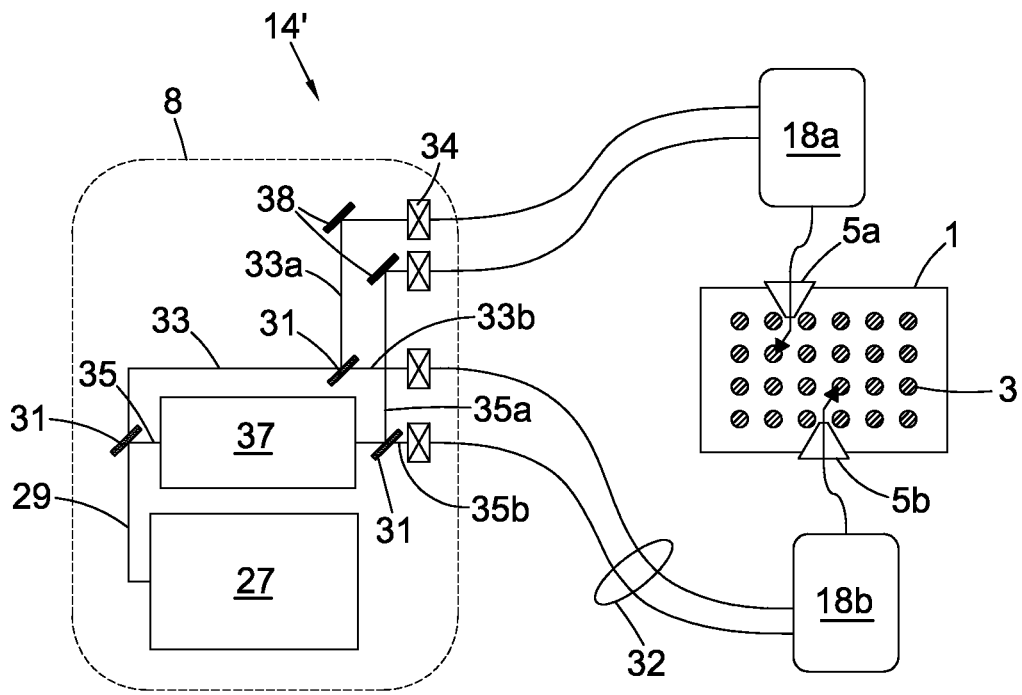
FIG. 5 is a schematic illustration of a portion of an alternative embodiment of a test system.

In some embodiments a DUT 1 may be tested using more than one probe 5 and more than one sampling module 18. FIG. 5 is a schematic illustration of a portion of a test system 14' which includes a test apparatus 8 comprising a first sampling module 18a and a second sampling module 18b. The first sampling module 18a is connected to a first probe 5a and the second sampling module 18b is connected to a second probe 5b. Both the first and second probes 5a, 5b are brought into contact with electrical contacts 3 on a DUT 1.

The first and second sampling modules 18a are provided with radiation emitted from a radiation source 27 (e.g. a laser). The radiation beam 27 emits a radiation beam 29 which is split into a generating beam 33 and a receiving beam 35 by a beam splitter 31. The receiving beam 35 is directed to a delay line 37 which is operable to introduce an optical delay between the generating and receiving beams 33, 35. The generating beam 33 is split into first and second portions 33a, 33b by a beam splitter 31. The receiving beam 35 is split into first and second portions 35a, 35b by a beam splitter 31. The first portion of the generating beam 33a and the first portion of the receiving beam 35a are provided to the first sampling module 18a. The first and second portions of the generating and receiving beams are coupled into optical fibres 32 by fibre couplers 34 and via mirrors 38. The second portion of the generating beam 33a and the second portion of the receiving beam 35a are provided to the second sampling module 18b.

In the arrangement which is shown in FIG. 5, the first and second sampling modules 18a, 18b are operated using common generating 33 and receiving beams 35. In such an arrangement it is possible for the sampling modules 18a, 18b to measure signals which are transmitted between the first and second probes 9A, 9B through the DUT 1, in addition to signal which is reflected in the DUT 1. A reflected signal may be separated from a transmitted signal by selectively turning off the generation of pulses at each sampling module 18a, 18b in turn. For example, the first sampling module 18a may initially generate signal pulses. The transmission of the pulses may be measured by the second sampling module 18b and the reflection of the pulses may be measured by the first sampling module 18a. Subsequently, the second sampling module 18b may generate signal pulses. The transmission of the pulses may be measured by the first sampling module 18a and the reflection of the pulses may be measured by the second sampling module 18b.

The measurements described above may be used to form a 2×2 matrix S which describes the coupling between two electrical contacts and is given by equation (1).

$$S = \begin{pmatrix} S_{11} & S_{12} \\ S_{21} & S_{22} \end{pmatrix} \quad (1)$$

The element $S_{11}$ represents a signal inserted at a first electrical contact and reflected back to the first electrical contact. The element $S_{22}$ represents a signal inserted at a second electrical contact and reflected back to the second electrical contact. The element $S_{21}$ represents a signal inserted at the first electrical contact and transmitted to the second electrical contact. The element $S_{12}$ represents a signal inserted at the second electrical contact and transmitted to the first electrical contact. The matrix S may be referred to as an S-parameter measurement or a scattering matrix of a DUT 1.

In some embodiments a test system may comprise more than two sampling modules and may simultaneously test a DUT 1 through more than two electrical contacts. In general an N×N S-parameter matrix may be derived by sampling a DUT 1 through N electrical contacts.

Whilst the embodiment which is shown in FIG. 5 includes a delay line 37, it will be appreciated that a delay between a generating 33 and receiving beam 35 may alternatively be introduced by using a dual-laser system. A first laser may emit a generating beam 33 and a second laser may emit a receiving beam 35. The first and second lasers may be synchronised and a synchronisation between the lasers controlled in order to control an optical delay between the generating and receiving beams.

As has been described above a DUT 1 may be tested through one or more probes 7, brought into contact with one of more electrical contacts using a variety of different methods. Signals are input into a DUT 1 via a probe and a reflection and/or transmission of the signal by the DUT 1 is transmitted, via a probe, to a test apparatus for measurement. In the following described embodiments, emphasis is placed on measurements of signal which is reflected by a DUT 1. However, it will be appreciated that similar principles apply to the measurement of transmitted signals. The following description may therefore equally apply to the measurement of transmitted signals as opposed to the measurement of reflected signals.

Embodiments of a probe 5 are described above in which the probe 5 includes a coaxial transmission line arrangement 7. A probe 5 of the type shown in FIG. 2 is typically an expensive piece of equipment. Over time a probe may be used to contact several electrical contacts on a DUT 1 and may be used to contact many different DUTs 1. Repeated use of a probe may cause damage to the probe. For example, the probe ends 13, 15 of a probe 5 may become oxidised due to contact with electrical contacts on a DUT 1 (which may for example comprise solder).

Additionally or alternatively a probe may be physically damaged (e.g. may be bent) by forcing a probe into contact with electrical contacts. The separation between probe ends 13, 15 on a probe 5 may not be the same as the separation between adjacent electrical contacts 3 on a DUT 1. Arranging a probe 5 such that both probe ends 13, 15 are in contact with an electrical contact 3 may therefore be difficult and may lead to attempts to force the probe ends 13, 15 onto the electrical contacts 3. Such forcing may apply stress to the probe and may cause damage to components of the probe 5.

A damaged probe 5 may need to be replaced at considerable expense. It is therefore desirable to provide a probe which allows the probe to be provided at a cheaper cost to existing probes.

Figure 6:
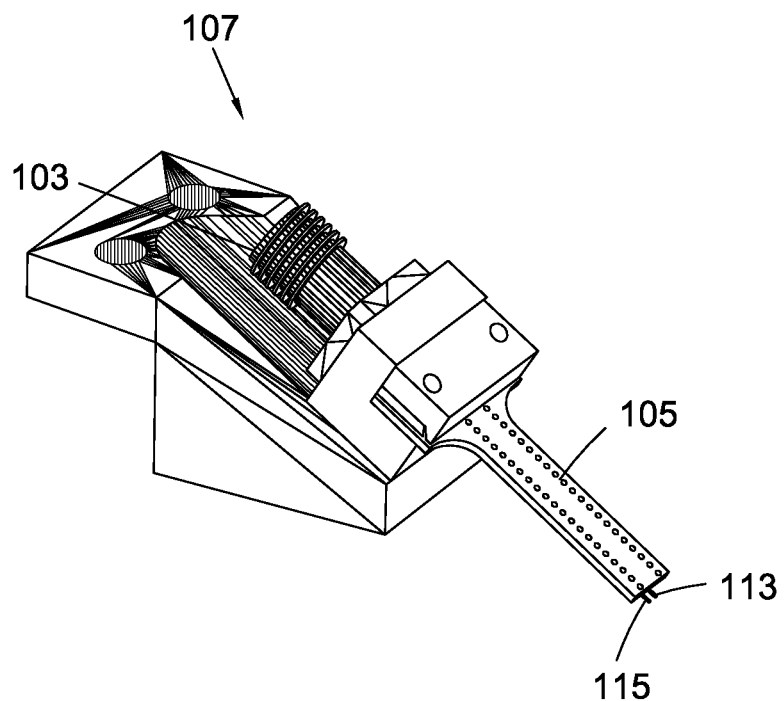
FIG. 6 is a schematic illustration of a probe according to an embodiment of the invention.

FIG. 6 is a schematic illustration of a probe 107 according to an embodiment of the invention. The probe 107 comprises a connection 103 a transmission line arrangement 105 and probe ends 113, 115. The connection 103 is configured for connection to a test apparatus 8 (not shown in FIG. 6). The probe ends 113, 115 are configured for connection to electrical contacts on a DUT 1 (not shown in FIG. 6). The end of the probe 107 at which the probe ends 113, 115 are situated may be referred to as a first end of the probe. The first end of the probe is adapted for connection to a DUT 1. The end of the probe 107 at which the connection 103 is situated may be referred to as a second end of the probe. The second end of the probe is adapted for connection to a test apparatus 8.

The transmission line arrangement is configured to transmit a signal between the first end of the probe and the second end of the probe. In the embodiment which is shown in FIG. 6 the transmission line arrangement 105 is formed on a printed circuit board (PCB). A PCB is formed from an electrically insulating material and can support electrically conductive pathways through or on the PCB. For example a transmission line arrangement 105 comprising a plurality of conducting pathways may be supported by the PCB. PCB manufacturing techniques are well established and as such the cost of manufacturing a transmission line arrangement on a PCB may be relatively inexpensive and may be significantly less, for example, than the cost of manufacturing a coaxial probe of the type shown in FIG. 2.

A transmission line arrangement may comprise a signal conductor and a ground conductor. It is desirable to provide a transmission line arrangement which transmits a signal with relatively little dispersion and/or signal loss. However, some transmission line arrangements formed on a PCB typically suffer from greater signal loss and/or dispersion than, for example, a standard coaxial transmission line.

Figure 7:
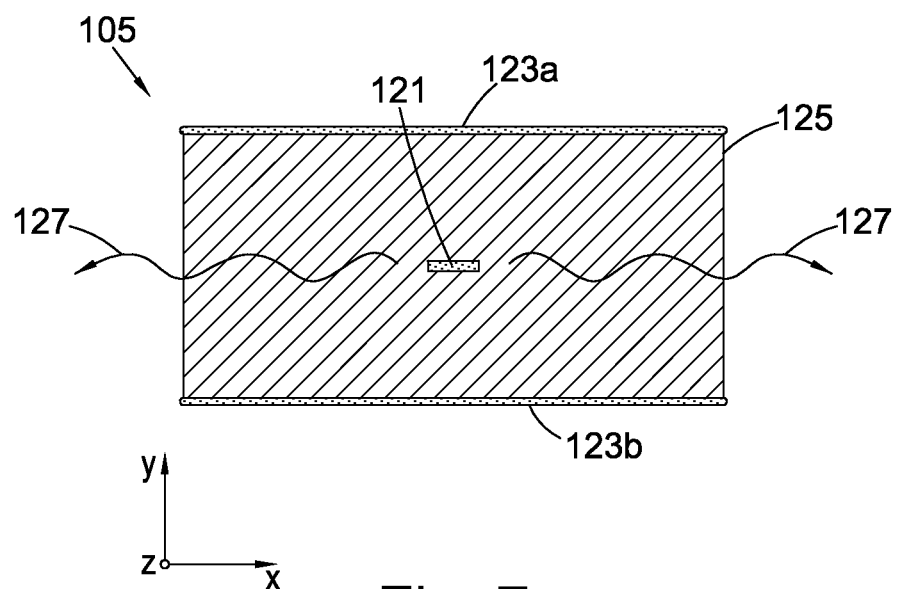
FIG. 7 is a schematic illustration of portion of a transmission line arrangement.

FIG. 7 is a schematic illustration of a cross-sectional view of a transmission line arrangement which may be formed in a PCB. The transmission line arrangement comprises a signal conductor 121, a first conducting sheet 123a and a second conducting sheet 123b. The signal conductor 121 is separated from the first and second conducting sheets 123a and 123b by portions of an insulating material 125 which forms the PCB on which the transmission line arrangement 105 is formed. The signal conductor 121 and the first and second conducting sheets 123a, 123b extend into and out of the page (i.e. in the z-direction indicated in FIG. 7). The conducting sheets 123a, 123b may be referred to as ground planes.

In use, a signal to be injected into a DUT is transmitted by the signal conductor 121. For example a test apparatus 8 which is connected to a second end of a probe may emit a signal pulse which may be transmitted between the second and first ends of the probe via the signal conductor 121. In the arrangement which is shown in FIG. 7, signal loss may occur through radiation out of the sides of the transmission line arrangement and between the conducting sheets. Additionally or alternatively radiation out of the sides of the transmission line arrangement may cause dispersion of signals transmitted along the signal conductor 121. Radiation out of the sides of the transmission line arrangement 105 is schematically depicted with arrows labelled 127 in FIG. 7.

The transition line arrangement 105 which is shown in FIG. 7 may in particular suffer from signal loss and/or dispersion at high frequencies. For example, signal components having a frequency of about 30 GHz or more may suffer significant loss and/or dispersion in the arrangement shown in FIG. 7. As was described above it may be desirable to provide a transmission line arrangement which is capable of transmitting signal components having a frequency which is greater than about 30 GHz. For example, it may be desirable to transmit signal components having a frequency of about 100 GHz or more, a frequency of about 150 GHz or more or about 200 GHz or more. In some embodiments is may be desirable to transmit signal components in excess of 200 GHz, for example, up to about 10 THz. It may therefore be desirable to provide a transmission line arrangement which is capable of transmitting signal components (with reduced signal loss and/or dispersion) having a higher frequency than the components transmitted by the transmission line arrangement shown in FIG. 7.

Figure 8A:
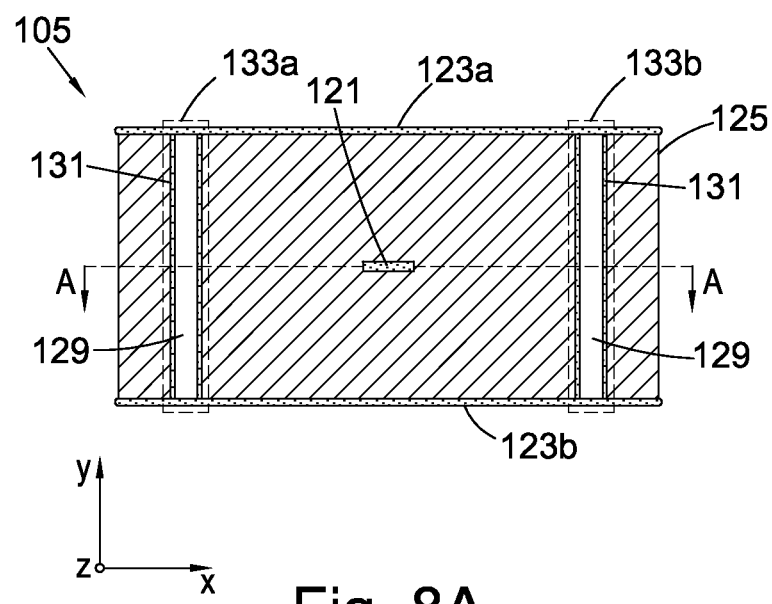
FIGS. 8A and 8B are schematic illustrations of a transmission line arrangement according to an embodiment of the invention.
Figure 8B:
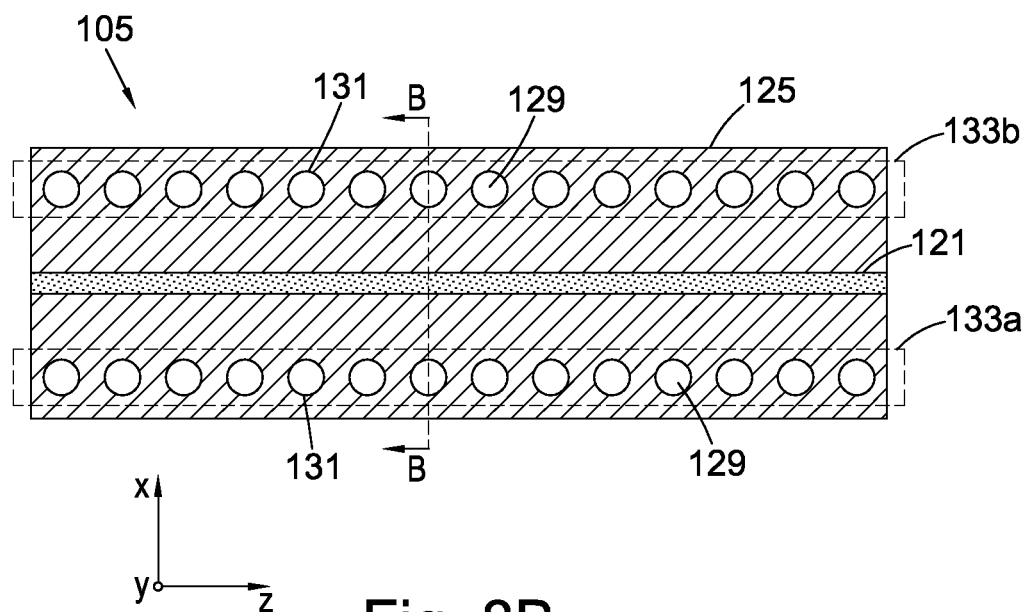

FIGS. 8A and 8B are schematic illustrations of a transmission line arrangement 105 according to an embodiment of the invention. FIGS. 8A and 8B both show cross-sections through the transmission line arrangement 105. Also shown in FIGS. 8A and 8B are Cartesian co-ordinates which are consistently used in FIGS. 8A and 8B. The transmission line arrangement 105 generally extends in the z-direction shown in the Figures. FIG. 8A is a cross-section through an x-y plane B-B (the plane B-B is indicated in FIG. 8B). FIG. 8B is a cross-section through an x-z plane A-A (the plane A-A is indicated in FIG. 8A).

The transmission line arrangement 105 which is shown in FIGS. 8A and 8B include some of the same components as the transmission line arrangement which is shown in FIG. 7. Common features are provided with common reference numerals. Similarly to the arrangement shown in FIG. 7, the transmission line arrangement 105 which is shown in FIGS. 8A and 8B comprises a first conducting sheet 123a, a second conducting sheet 123b and a signal conductor 121. The signal conductor 121 is separated from the first and second conducting sheets 123a and 123b by portions of an insulating material 125 which forms the PCB on which the transmission line arrangement 105 is formed.

The transmission line arrangement 105 of FIGS. 8A and 8B further comprises holes 129 formed in the insulating material 125. The holes extend between the first and second conducting sheets 123a, 123b. The insides of the holes 129 include a conducting material 131 which provides conducting pathways between the first and second conducting sheets 123a, 123b. In the example shown in FIGS. 8A and 8B the insides of the holes 129 are coated in conducting material 131. A hole 129 whose insides are coated with a conducting material 131 may be referred to as a plated through hole. In other embodiments a conducting material 131 may not coat the insides of a hole but may merely be situated inside the hole. In some embodiments the holes 129 may be completely filled with conducting material 129. In other embodiments, only a portion of the space defined by the holes 129 may be occupied by conducting material 131.

The plurality of holes 129 comprises a first group of holes 133a and a second group of holes 133b. The first group of holes 133a is positioned on a first side of the signal conductor 121. The second group of holes 133b is positioned on a second side of the signal conductor 121, the second side being substantially opposite the first side.

In the arrangement of FIGS. 8A and 8B, the first conducting sheet 123a is formed substantially in a first plane (an x-z plane). The second conducting sheet 123b is formed substantially in a second plane (an x-z plane). The first and second planes are substantially parallel to each other. The holes 129 extend in a direction (the y-direction) which is substantially perpendicular to the planes in which the first and second conducting sheets 123a, 123b are substantially situated. In other embodiments one or both of the first and second conducting sheets 123a, 123b may not be flat and may not therefore be formed substantially in first and second planes.

In the arrangement of FIGS. 8A and 8B, the signal conductor 121 extends in the z-direction, which represents a direction in which a signal may be transmitted along the signal conductor 121. The first group of holes 133a and the second group of holes 133b are substantially aligned in two parallel lines which extend in the z-direction. The lines of holes therefore extend substantially parallel to the direction in which the signal conductor 121 extends.

The holes 129 are separated from the signal conductor 121 by portions of the insulating material 125. The conducting sheets 123a, 123b and the conducting material 131 in the holes 129 together form a ground conductor. The ground conductor may transmit a ground current between the first and second ends of the probe 107.

In the plane B-B (a cross-section of which is shown in FIG. 8A) the conducting material 131 in the holes 129 and the conducting sheets 123a, 123b together serve to substantially surround the signal conductor 121 with conducting material. This reduces radiation of energy out of the sides of the transmission line arrangement 105 and between the conducting sheets 123a, 123b. This advantageously reduces any loss and/or dispersion of signal pulses which are transmitted along the signal conductor 121.

The cross-sectional shape of the transmission line arrangement 105 which is shown in FIG. 8A is similar to a coaxial transmission line arrangement in that it includes a central signal conductor 121 surrounded by a ground conductor, where the signal conductor 121 and the ground conductor are separated from each other by portions of an insulating material 125. Coaxial transmission line arrangements are known for being able to transmit signals with relatively small amounts of signal loss and dispersion across a broad range of frequencies. The transmission line arrangement 105 which is shown in FIGS. 8A and 8B replicates these advantageous properties of a coaxial transmission line. However, the arrangement shown in FIGS. 8A and 8B provides a further advantage in that it can be manufactured relatively cheaply. For example, the transmission line arrangement shown in FIGS. 8A and 8B may be manufactured using standard PCB manufacturing techniques.

It will be appreciated from, for example, FIG. 8B that adjacent holes 129 through the insulating material 125 may be separated from each other by portions of the insulating material 125. Consequently portions of the length of the signal conductor may not be entirely surrounded by the conducting sheets 123a, 123b and the plurality of holes 129 at all positions along the z-axis.

References herein to the signal conductor 121 being substantially surrounded by holes 129 and conducting sheets 123a, 123b is intended to refer to the signal conductor 121 being surrounded in two-dimensions. That is, in the cross-section taken through the transmission line arrangement 105 shown in FIG. 8A, the holes and the conducting sheets together substantially encompass the signal conductor 121. References herein to the signal conductor 121 being substantially surrounded is not intended to mean that the signal conductor 121 is surrounded from all directions (i.e. surrounded in three dimensions).

In some embodiments, the plurality of holes 129 and/or the conducting sheets 123a, 123b may not extend along the entire length of the signal conductor 121. For example, the transmission line arrangement 105 may include one or more portions of its length at which one or both of the conducting sheets 123a, 123b are not present. Additionally or alternatively the transmission line arrangement 105 may include one or more portions of its length at which holes are only positioned to one side of the signal conductor 121. Additionally or alternatively the transmission line arrangement 105 may include one or more portions of its length at which no holes 129 are present. One or more portions of the transmission line arrangement 105 at which one or both of the conducting sheets 123a, 123b are not present or at which holes 129 are only positioned to one side of the signal conductor 121 or at which no holes 129 are present may, for example, be positioned towards an end of the transmission line arrangement 105 (i.e. near to the first or second end of the probe).

In some embodiments, the signal conductor 121, the conducting sheets 123a, 123b and the holes 129 may not all be arranged parallel and perpendicular to each other. For example, in some embodiments the holes 129 may not be confined to lines which run parallel to the signal conductor 121. In some embodiments, one or both of the conducting sheets 123a, 123b may not be flat. In some embodiments the holes may not be precisely perpendicular with a plane in which a conducting sheet 123a, 123b is substantially situated.

In general any arrangement of the signal conductor 121, the conducting sheets 123a, 123b and the plurality holes 129 may be adopted in which the holes 129 extend between the conducting sheets 123a, 123b and are arranged such that the holes 129 and the sheets 123a, 123b substantially surround the signal conductor 121 for at least part of its length between the first and second ends of the probe 107.

As was described above a transmission line arrangement 105 of the type shown in FIGS. 8A and 8B advantageously increases the frequency at which significant signal loss and/or dispersion occurs (when compared to, for example, the transmission line arrangement shown in FIG. 7). However, conducting material 131 in the holes 129 may act as an antenna at some frequencies. Conducting material 131 which acts as an antenna will absorb radiation at frequencies in the region of a resonant frequency of the antenna. A signal which passes along the signal conductor 121 and which has frequency components in the region of a resonant frequency of an antenna (formed by conducting material 131 in one or more holes 129) will be attenuated by the antenna. It is therefore desirable that any antennas formed by conducting materials have a resonant frequency which is outside a frequency range of signal components to be transmitted along the transmission line arrangement 105.

Figure 9A:
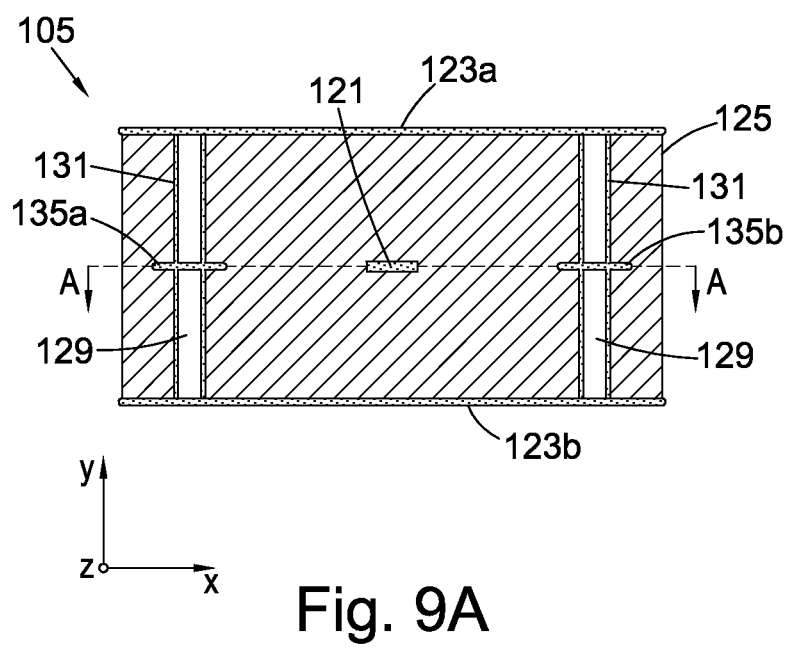
FIGS. 9A and 9B are schematic illustrations of a transmission line arrangement according to an alternative embodiment of the invention.
Figure 9B:
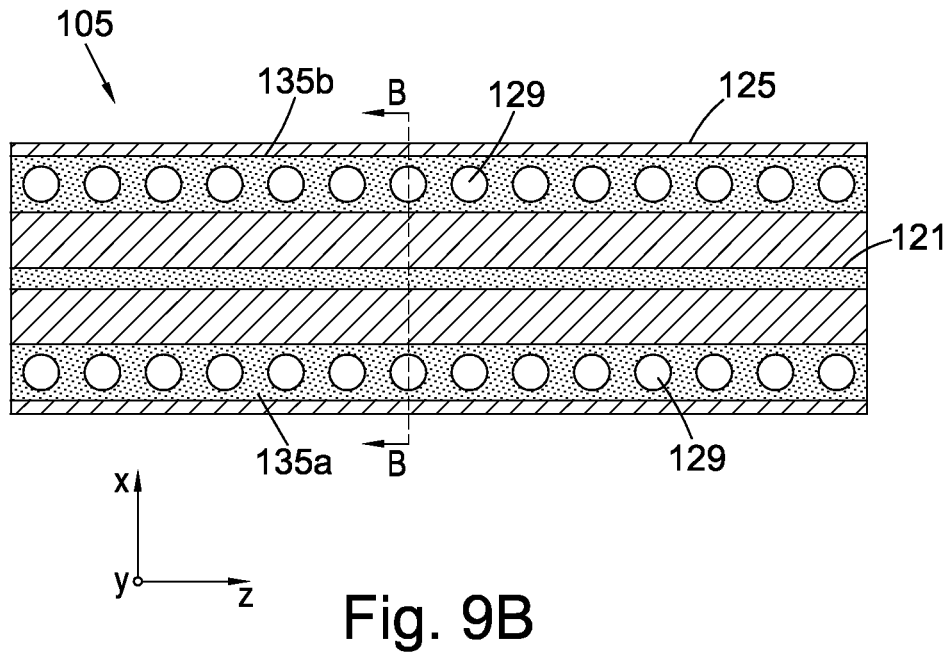

The resonant frequency of an antenna depends at least in part on its dimensions. For example, in general shortening an antenna will increase the resonant frequency of the antenna. FIGS. 9A and 9B are schematic illustrations of a transmission line arrangement 105 according to an alternative embodiment of the invention. Similarly to FIGS. 8A and 8B, FIGS. 9A and 9B both show cross-sections through the transmission line arrangement 105. The same Cartesian coordinate system which was used in FIGS. 8A and 8B is also used in FIGS. 9A and 9B. FIG. 9A is a cross-section through an x-y plane B-B (the plane B-B is indicated in FIG. 9B). FIG. 9B is a cross-section through an x-z plane A-A (the plane A-A is indicated in FIG. 9A).

The transmission line arrangement 105 which is shown in FIGS. 9A and 9B has all of the features of the transmission line arrangement shown in FIGS. 8A and 8B. Like reference numerals are used to denote like features and these features will not be described again with reference to FIGS. 9A and 9B. The transmission line arrangement 105 of FIGS. 9A and 9B further comprises a first conductor 135a and a second conductor 135b. Both the first and second conductors 135a, 135b extend between a plurality of the holes 129 and intersects the holes 129 in between the first and second conducting sheets 123a, 123b. In the example shown in FIGS. 9A and 9B, the conductors 135a, 135b intersect the holes 129 approximately midway between the first and second conducting sheets 123a, 123b. However, in other embodiments the conductors 135a, 135b may intersect the holes 129 at other locations between the conducting sheets 123a, 123.

The conductors 135a, 135b serve to effectively split an antenna formed by conducting material 131 in the holes 129 into two separate antennas. That is, for each hole 129 a first antenna is formed between the first conducting sheet 123a and a conductor 135a, 135b and a second antenna is formed between the second conducing sheet 123b and a conductor 135a, 135b. The conductors 135a, 135b therefore serve to shorten the length of any antennas formed by conducting material 131 inside the holes 129. As was described above shortening the length of an antenna tends to increase the resonant frequency of the antenna. The conductors 135a, 135b therefore serve to increase the frequencies at which conducting material 131 in the holes 129 causes attenuation of signal components propagating along the signal conductor 121.

Figure 10:
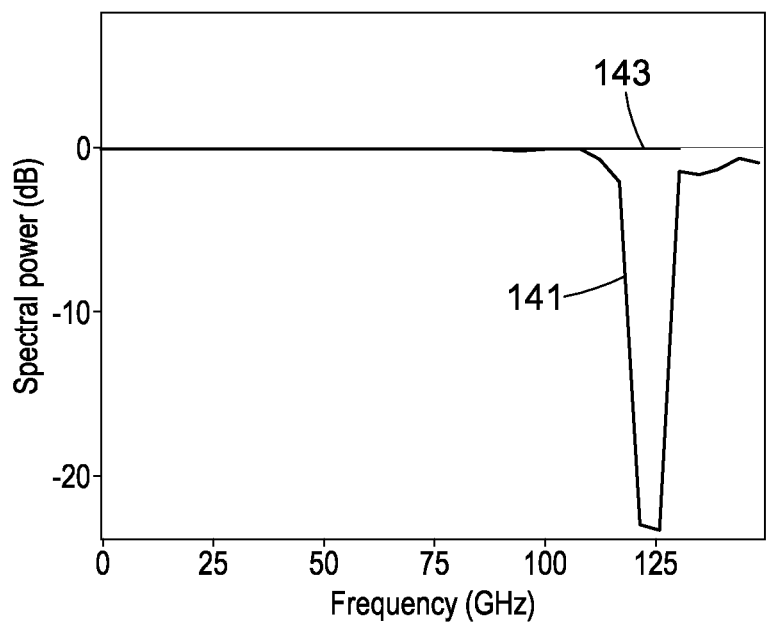
FIG. 10 is a schematic representation of the spectral power of signal transmitted by a transmission line arrangement.

FIG. 10 is a schematic representation of transmitted signal power as a function of frequency for two different transmission line arrangements. The transmitted power which is shown in FIG. 10 represents the spectral power which is output from a transmission line arrangement after a pulse having a power of 0 dB at all frequencies is input into the transmission line arrangement. A line which is labelled 141 in FIG. 10 represents power which is output from a transmission line arrangement of the form which is shown in FIGS. 8A and 8B. That is, the line 141 represents the power which is output from a transmission line arrangement which does not include conductors 135a, 135b which intersect holes 129 in the transmission line arrangement. It can be seen from FIG. 10 that such a transmission line arrangement sharply attenuates signal in the region of 125 GHz. In this example, antennas which are formed from conducting material 131 in holes 129 in the transmission line arrangement have a resonant frequency of approximately 125 GHz.

A line which is labelled 143 in FIG. 10 represents power which is output from a transmission line arrangement of the form which is shown in FIGS. 9A and 9B. That is, the line 143 represents the power which is output from a transmission line arrangement which includes conductors 135a, 135b which intersect holes 129 in the transmission line arrangement. As was described above with reference to FIGS. 9A and 9B, the conductors 135a, 135b serve to increase the resonant frequency of antennas in the transmission line arrangement 105. Frequencies at which signal components are attenuated by the antennas are therefore increased to greater than 125 GHz. Consequently, and as can be seen in FIG. 10, the transmission line arrangement does not substantially attenuate the signal at frequencies in the region of 125 GHz. The transmission line arrangement which is represented by the line 143 in FIG. 10 instead shows no substantial signal attenuation up to a frequency of at least 150 GHz.

Figure 11:
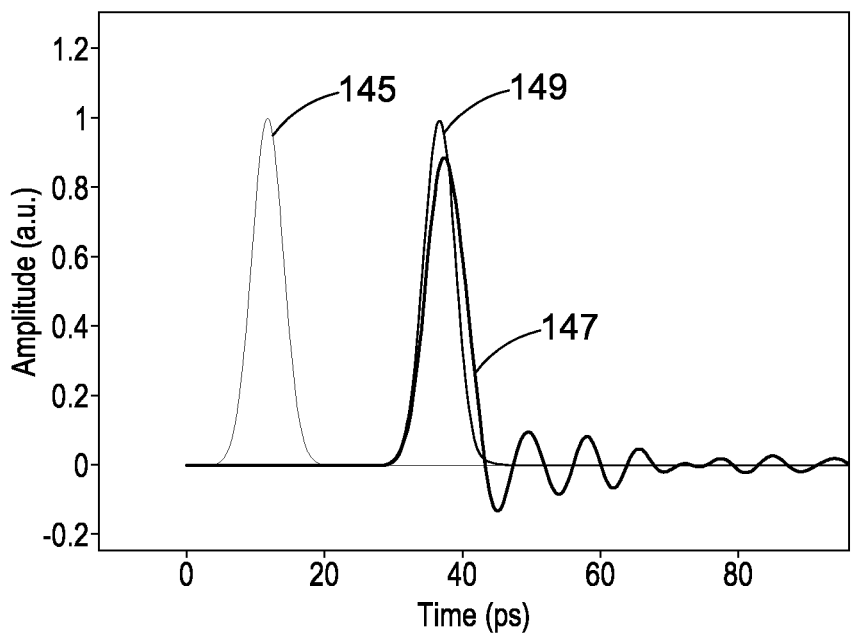
FIG. 11 is a schematic representation of a signal pulse transmitted by transmission line arrangement.

FIG. 11, is a schematic representation of the amplitude of a signal pulse as a function of time after having been input into a transmission line arrangement. The amplitude is given in arbitrary units (a.u.) in FIG. 11. The amplitude which is shown in FIG. 11 represents the amplitude of the signal integrated across all frequency components in the signal. In the illustrated example, the signal has a negligible power at frequencies above about 150 GHz. A line labelled 145 in FIG. 11 represents a signal pulse which is input into a transmission line arrangement. A line labelled 147 in FIG. 11 represents signal which is output from a transmission line arrangement of the form shown in FIGS. 8A and 8B (i.e. a transmission line arrangement which does not include conductors 135a, 135b which intersect holes 129 in the transmission line arrangement). A line labelled 149 in FIG. 11 represents signal which is output from a transmission line arrangement of the form which is shown in FIGS. 9A and 9B (i.e. a transmission line arrangement including conductors 135a, 135b which intersect holes 129 in the transmission line arrangement).

As can be seen in FIG. 11, the transmission line which is represented by the line 147 in FIG. 11 attenuates the signal pulse. Furthermore, the signal pulse is followed by a series of smaller pulses. These smaller pulses are caused by radiation of signal from antennas (formed from conducting material inside holes in the transmission line arrangement) after the main signal pulse has passed through the transmission line arrangement.

In contrast to the transmission line arrangement which is represented by the line 147 in FIG. 11, the transmission line arrangement which is represented by the line 145 in FIG. 11 does not substantially attenuate the signal pulse and does not causes the emission of smaller pulses after the main signal pulse. As was described above, this is caused by the effect of conductors 135a, 135b which serve to increase the resonant frequency of antennas formed by conductive material 131 in holes in the transmission line arrangement. In the illustrated example, the resonant frequency has been increased to a frequency greater than about 150 GHz. Since the input signal has a negligible power at frequencies greater than about 150 GHz, the antennas cause substantially no attenuation of the input signal.

In general, it is desirable for the resonant frequency of conducting material 131 in holes 129 in a transmission line arrangement to be outside of a frequency range of interest. For example, if it is desired to transmit frequency components in a range of about 0.01 GHz-150 GHz then it is desirable to provide a transmission line arrangement in which the resonant frequency of any antennas is greater than about 150 GHz. As was described above, in the example transmission lines which are presented herein, including first and second conductors 135a, 135b serves to increase the resonant frequency of antennas in the transmission line arrangement to frequencies greater than about 150 Hz.

In other embodiments conductors 135a, 135b may be arranged to increase the resonant frequency of any antennas to higher frequencies. For example, the resonant frequencies may be increased to frequencies above about 200 GHz. In some embodiments conductors 135a, 135b may be arranged to increase the resonant frequencies to frequencies much greater than 200 GHz, for example, about 1 THz or more or even 10 THz or more.

Some embodiments may include multiple conductors which intersect a plurality of holes. For example, each hole of a plurality of holes may be intersected by two or more conductors between the first and second conducting sheets 123a, 123b. Different conductors may intersect the holes 129 at different distances from the first conducting sheet 123a. It will be appreciated that each additional conductor which intersects a hole will serve to further decrease the length of antennas formed from conducting material 131 in the hole 129 and will therefore further increase the resonant frequency of the antennas.

Some embodiments may not include any conductors which intersect holes 129 in the transmission line arrangement. Depending on the dimensions of the transmission line arrangement and on the frequency range of interest in a given application, a transmission line arrangement which does not include any intersecting conductors may not significantly attenuate signal components of interest. A transmission line arrangement of the form shown in FIGS. 8A and 8B may therefore be advantageously used for some applications.

Embodiments have been described above in which conducting pathways are provided between conducting material inside holes in an insulating material. In other embodiments conducting material which extends between the conducting sheets may be provided at other locations than inside of holes in an insulating material. For example, conducting material may be provided on the sides of an insulating material.

Figure 12:
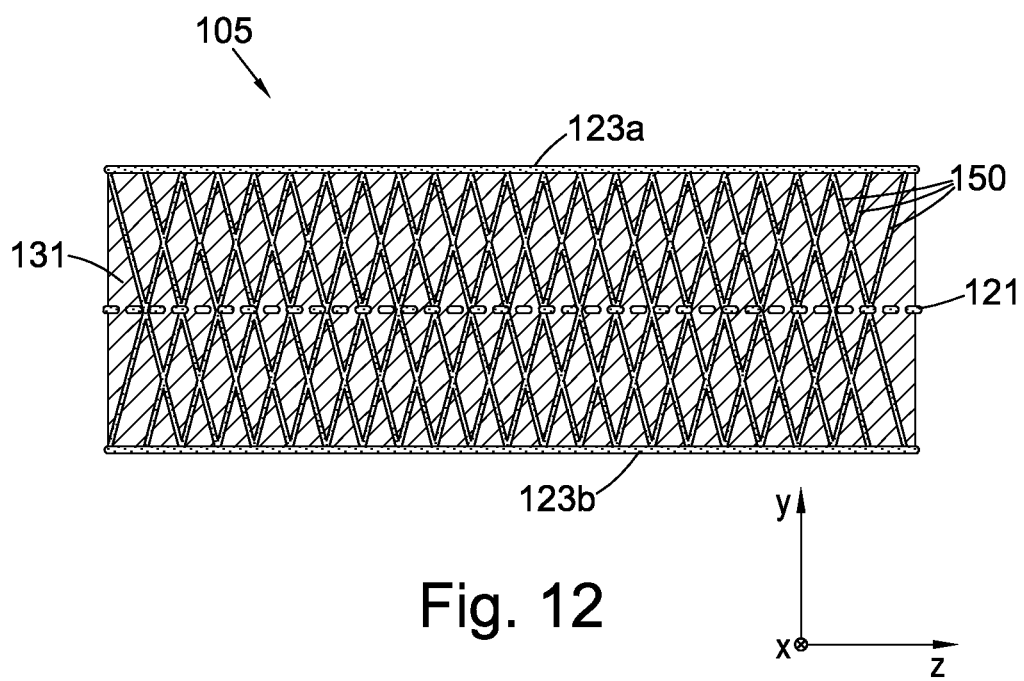
FIG. 12 is a schematic illustration of a transmission line arrangement according to an alternative embodiment of the invention.

FIG. 12 is a schematic illustration of an embodiment of a transmission line arrangement 105 in which pieces of conducting material are provided on the outside of an insulating material. FIG. 12 shows a side-on view of the transmission line arrangement 105. The transmission line arrangement 105 comprises a signal conductor, a first conducting sheet 123a, a second conducting sheet 123b and an insulating material 131 separating the conducting sheets 123a, 123b from the signal conductor 121. The location of the signal conductor 121 is represented as a dashed line in FIG. 12 since it is embedded in the insulating material 131 and would not therefore be visible in a side view of the transmission line arrangement 105. It will be appreciated that, in practice, the signal conductor 121 provides a continuous conducting pathway between first and second ends of the transmission line arrangement.

The transmission line arrangement 105 further comprises pieces of conducting material 150 situated on the side of the insulating material 131. The pieces of conducting material 150 extend between the first and second conducting sheets 123a, 123b. Different pieces of conducting material 150 are situated at different positions between first and second ends of the transmission line arrangement 105. That is, different pieces of conducting material 150 are situated at different distances from an end of the transmission line arrangement 105. The pieces of conducting material 150 provide conducting pathways between the first and second conducting sheets 123a, 123b.

The transmission line arrangement 105 further comprises pieces of conducting material 150 situated on another side of the transmission line arrangement 105 (not shown in FIG. 12). The pieces of conducting material and the conducting sheets 123a, 123b are arranged to substantially surround the signal conductor 121 for at least part of its length between the first and second ends of the transmission line arrangement 105. The pieces of conducting material 150 therefore have a similar effect to the conducting material 131 provided in holes 129 as described above with reference to FIGS. 8 and 9. That is, the pieces of conducting material 150 reduce any radiation of energy out of the sides of the transmission line arrangement and therefore reduce attenuation and/or dispersion of signals transmitted by the transmission line arrangement 105.

Whilst not shown in FIG. 12, an embodiment of the type shown in FIG. 12 may further comprise one or more conductors which intersect the pieces of conducting material in between the first and second conducting sheets 123a, 123b so as to shorten any antennas formed by the pieces of conducting material. The one or more conductors may, for example, be similar to the conductors 135a, 135b described above with reference to FIGS. 9A and 9B.

The pieces of conducting material 150 which are shown in FIG. 12 are arranged in a mesh arrangement. The pieces of conducting material 150 may, for example, comprise a mesh of bond wires. The bond wires may for example have a thickness of the order of 100 micron. The bond wires may, for example, comprises wires formed from gold.

In other embodiments pieces of conducting material may be organised other than in a mesh arrangement. For example, pieces of conducting material 150 may extend substantially parallel with each other between the first and second conducting sheets 123a, 123b. Pieces of conducting material 150 may, for example, extend approximately perpendicular to planes in which the conducting sheets 123a, 123b are situated.

In general, any arrangement may be used which includes a plurality of pieces of conducting material extending between the first and second conducting sheets. At least some of the plurality of pieces of conducting material are arranged at different positions between first and second ends of the transmission line arrangement. That is, different pieces of conducting material 150 are situated at different distances from an end of the transmission line arrangement 105. The pieces of conducting material and the sheets are arranged to substantially surround the signal conductor for at least part of its length between the first and second ends of the transmission line arrangement. The pieces of conducting material may, for example, be provided inside holes in an insulating material which separates conducting sheets from a signal conductor (as described above with reference to FIGS. 8 and 9). Additionally or alternatively pieces of conducting material may be provided on sides of the insulating material (as described above with reference to FIG. 12).

Embodiments of a transmission line arrangement have been described above in the context of providing a transmission line arrangement in a probe for testing a device. However, the transmission line arrangements described herein may also be used in other applications and need not form part of a probe. In general, a frequency at which a transmission line may transmit signals can be increased by decreasing the dimensions of the transmission line. However, transmission lines having small dimensions may be difficult and expensive to manufacture and may suffer from other disadvantageous effects. For example, a transmission line having small dimensions may suffer from static discharge and may therefore be less robust. The transmission line arrangements described herein (in particular transmission line arrangements of the type shown in FIGS. 8 and 9) advantageously allow transmission lines to have relatively large dimensions whilst still transmitting signal components at relatively high frequencies. The transmission line arrangements may be relatively easy and inexpensive to manufacture. For example, PCB printing techniques may be used to manufacture the transmission line arrangements.

As was described above, a signal is transmitted through a probe 107 and input into a DUT 1. For example, a test apparatus 8 may generate a broadband signal pulse which is transmitted through a probe 107 and input into a DUT 1 with which the probe 107 is in contact. In general it is desirable for a high fraction of the signal power which is emitted from the test apparatus 8 to be input into the DUT 1. In practice, the fraction of the signal power which is input into the DUT 1 may be reduced by reflection of the signal before the signal reaches the DUT 1. For example, signal may be reflected at an interface between the test apparatus 8 and the second end of the probe 107 and/or may be reflected at an interface between the first end of the probe 107 and the DUT 1. Signal reflections which occur prior to the signal being input into the DUT 1 reduces the power of the signal which is input into the DUT 1. The test apparatus 8 is configured to measure signal which is reflected from within the DUT 1 and/or signal which is transmitted through the DUT 1. A reduction in the power of the signal which is input into the DUT 1 will therefore reduce the power of the signal which is measured by the test apparatus 8 and thus will reduce the signal to noise ratio of measurements made by the test apparatus 8.

As was described above, the test apparatus 8 may be configured to sample signal reflections and/or transmissions at a given delay time after signal is input into the DUT 1. In general signal which is reflected prior to being input into the DUT 1 will reach the test apparatus 8 at a different time to signal which is reflected from within the DUT 1 and/or transmitted through the DUT 1 and will not therefore be sampled by the test apparatus 8. However, some signal may undergo multiple reflections from different components of a test system before reaching the test apparatus 8. Such signal reflections may reach the test apparatus 8 during a time at which signal reflections and/or transmissions are sampled by the test apparatus 8 and may therefore interfere with measurements of the signal reflections and/or transmissions.

For at least the reasons described above it is desirable to provide a probe 107 which reduces any signal reflections which may occur before signal is input into a DUT 1. Signal is generally reflected at locations at which there is a change in the characteristic impedance along the propagation path of the signal. Signal reflections may also occur at locations at which there is a discontinuity in the cross-sectional shape of a transmission line along which the signal propagates. Conventional probes (e.g. the probe 5 which is shown in FIG. 2) typically have a uniform characteristic impedance along their length. For example, a typical probe 5 often has a characteristic impedance of approximately 50Ω along its length. A transmission line (e.g. transmission lines 21 shown in FIG. 4) of a testing apparatus 8 may be configured to substantially match the impedance of a transmission line arrangement in a probe. However, the characteristic impedance of electrical contacts on a DUT 1 generally have a different characteristic impedance to the characteristic impedance of a probe which contacts the electrical contacts. The interface between a probe and a DUT 1 is therefore often a source of undesirable signal reflections.

Figure 13A:
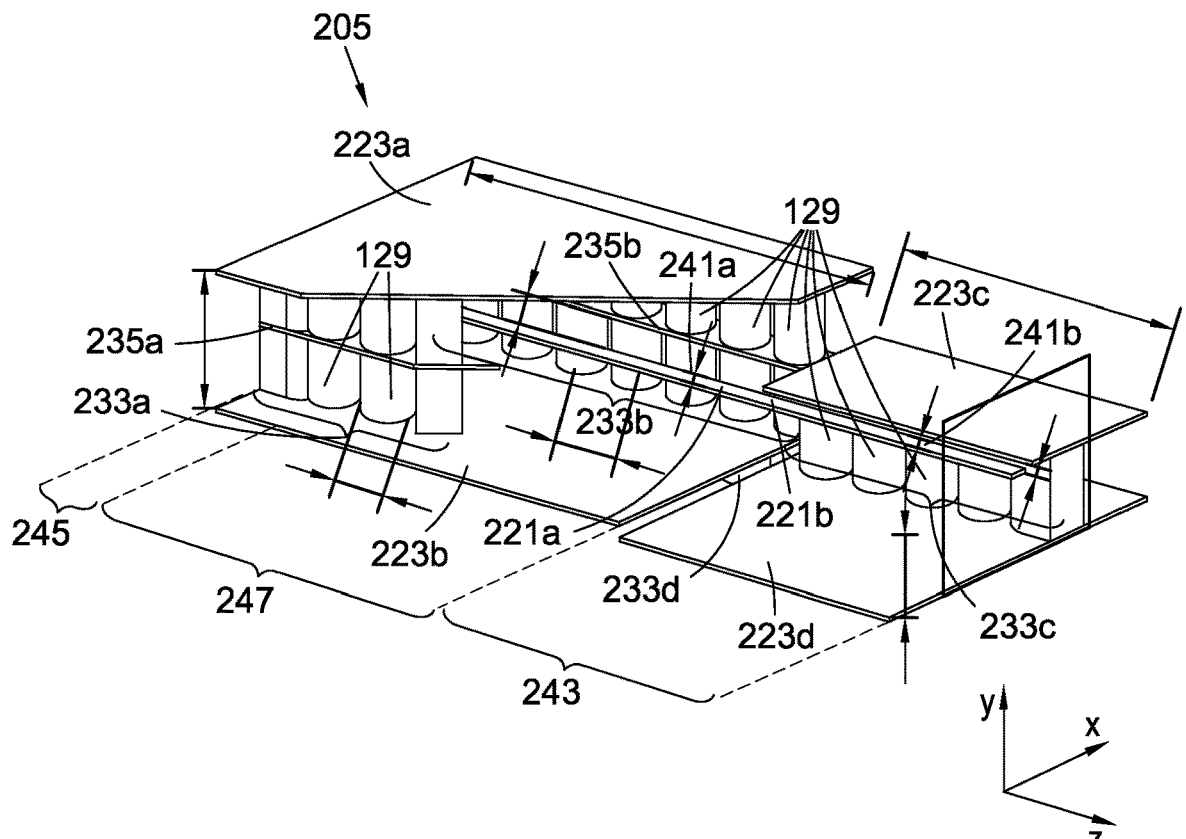
FIGS. 13A-13D are schematic illustrations of a transmission line arrangement which may form part of an embodiment of the invention.
Figure 13B:
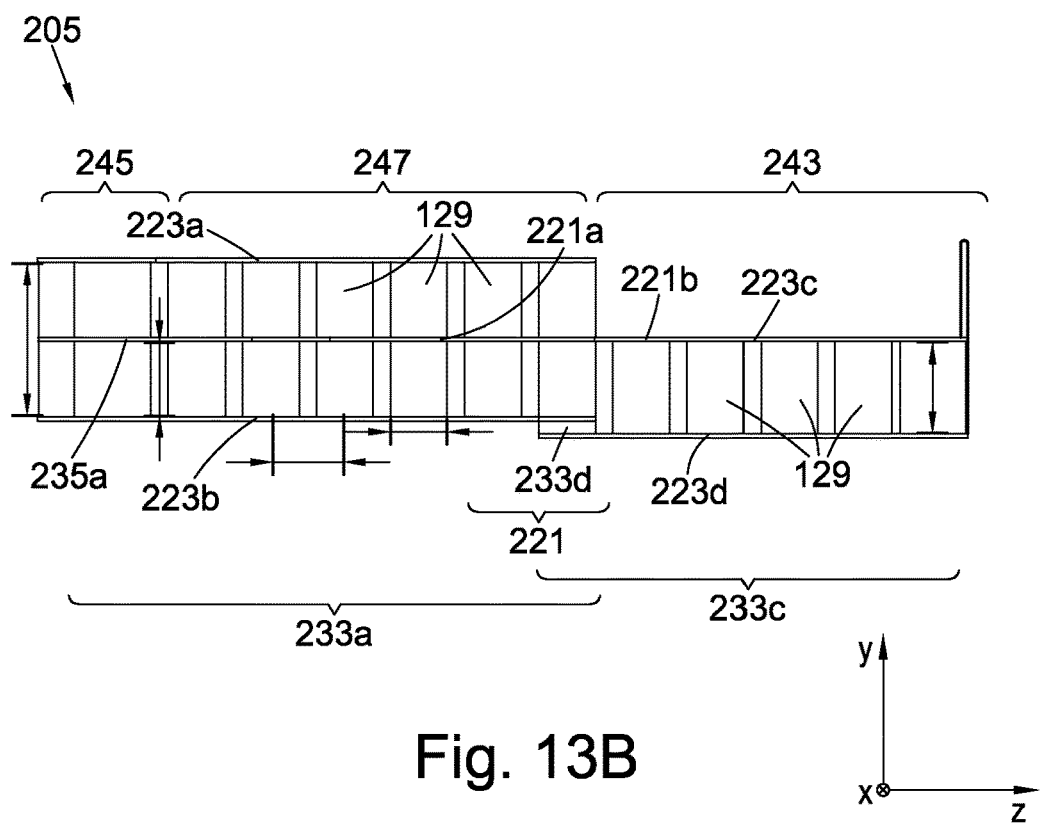
Figure 13C:
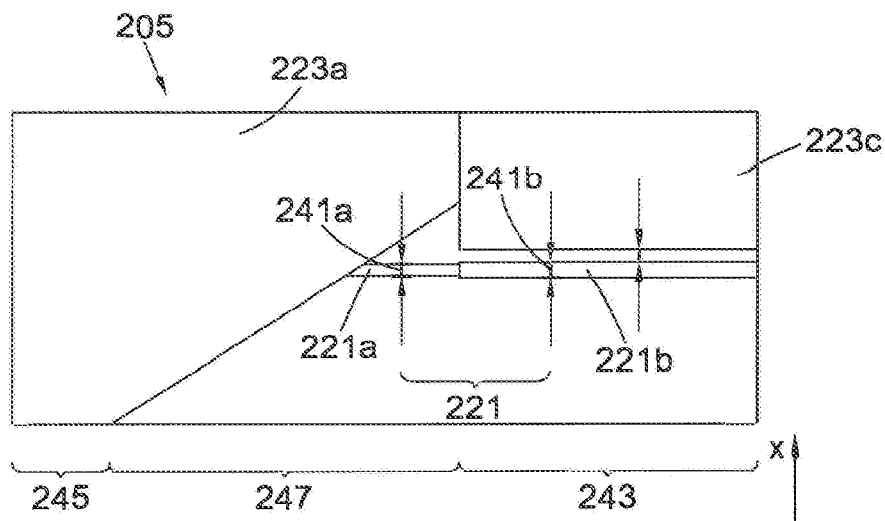
Figure 13D:
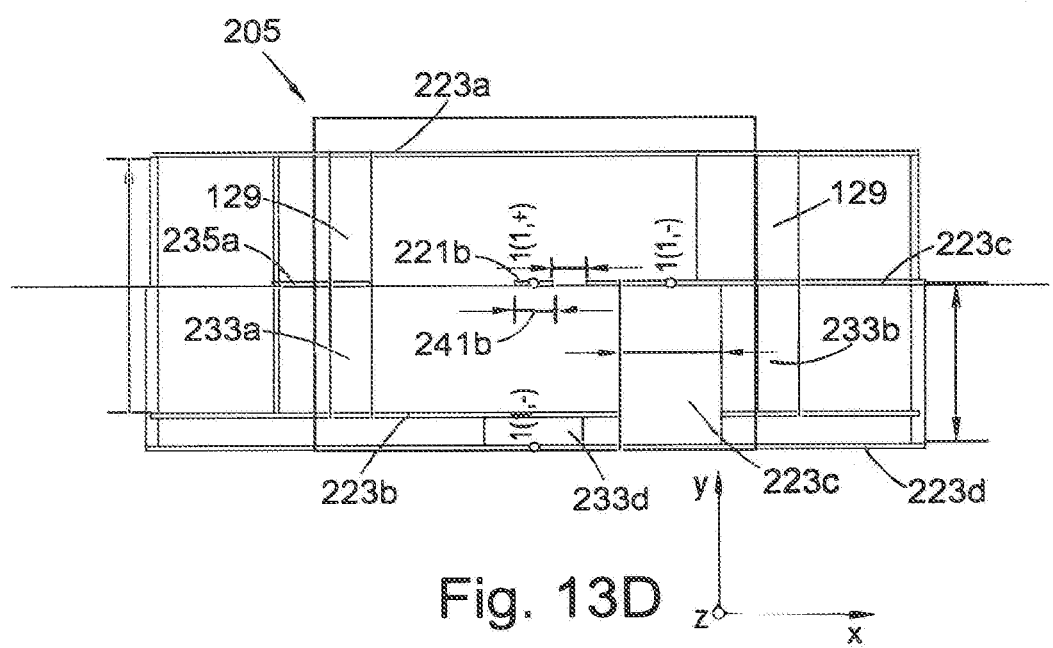

FIGS. 13A, 13B, 13C and 13D are schematic illustrations of a transmission line arrangement 205 which may form part of a probe according to an embodiment of the invention. FIG. 13A shows the transmission line arrangement 205 in perspective. FIG. 13B shows a side view of the transmission line arrangement 205. FIG. 13C shows a top down view of the transmission line arrangement 205. FIG. 13D shows an end on view of the transmission line arrangement 205. Cartesian co-ordinates are used consistently throughout FIGS. 13A-13D.

The transmission line arrangement comprises a signal conductor 221 formed from a first part 221a and a second part 221b. The first part 221a of the signal conductor 221 has a first width 241a. The second part 221b of the signal conductor 221 has a second width 241b. The second width 241b is greater than the first width 241a. For example, in an embodiment the first width 241a may be approximately 100 microns and the second width 241b may be approximately 110 microns.

The transmission line arrangement 205 further comprises a first conducting sheet 223a and a second conducting sheet 223b. The first conducting sheet is positioned above the first part 221a of the signal conductor 221. The second conducting sheet is positioned below the second part 221b of the signal conductor 221.

The transmission line arrangement 205 further comprises a third conducting sheet 223c and a fourth conducting sheet 223d. The third conducting sheet 223c is situated adjacent to the second part 221b of the signal conductor 221. The third conducting sheet 223c and the second part 221b of the signal conductor 221 are situated substantially in the same plane. The fourth conducting sheet 223d is positioned below the second part 221b of the signal conductor 221 and is substantially parallel with the third conducting sheet 223c.

Whilst not explicitly shown in FIGS. 13A-13D, the signal conductor 221 and the conducing sheets 223a-223d are separated from each other by portions of an insulating material. For example, the transmission line 205 arrangement may be formed on a PCB as was described above with reference to the transmission line arrangements 105 shown in FIGS. 7-9.

The transmission line arrangement 205 further comprises holes 129 which extend through the insulating material which separates the signal conductor 221 and the conducting sheets 223a-223d. The insides of the holes 129 include a conducting material which provides a conducting pathway between conducting sheets 223a-223d. For example, the holes 129 may be plated through holes whose insides are coated with a conducting material.

The holes 129 are arranged so as to form a first group of holes 233a, a second group of holes 233b and a third group of holes 233c. The first group 233a and the second group of holes 223b both extend between the first and second conducting sheets 223a, 223b and provide conducting pathways between the first and second conducting sheets 223a, 223b. The first group of holes 233a are situated on a first side of the first part 221a of the signal conductor 221. The second group of holes 233b are situated on a second side of the first part 221a of the signal conductor 221, where the second side is opposite the first side. The first group of holes 233a, the second group of holes 233b and the first and second conducting sheets 223a, 223b are arranged to substantially surround the first part 221a of the signal conductor 221 for a portion of its length.

The third group of holes 233c extends between the third conducting sheet 223c and the fourth conducting sheet 223d so as to provide conducting pathways between the third and fourth conducting sheets 223c, 223d. The third group of holes 233c are only situated on a single side of the second part 221b of the signal conductor 221. The third group of holes 233c and the third and fourth conducting sheets 223c, 223d are arranged such that they do not substantially surround the second part 221b of the signal conductor 221.

The transmission line arrangement 205 further includes a hole 233d which extends between the second conducting sheet 223b and the fourth conducting sheet 223d. Conducting material inside the hole 233d provides a conducting pathway between the second conducting sheet 223b and the fourth conducting sheet 223d.

The transmission line arrangement 205 further comprises a first conductor 235a and a second conductor 235b. The first conductor 235a extends between the first group of holes 233a and intersects the holes 129 in between the first and second conducting sheets 223a, 223b. The second conductor 235b extends between the second group of holes 235b and intersects the holes 129 in between the first and second conducting sheets 233a, 233b. The first conductor 235a and the second conductor 235b are similar to the first and second conductors 135a, 135b which were described above with reference to FIGS. 9A and 9B and act to shorten the length of antennas formed by conducting material in the holes 129. The resonant frequency of the antennas is therefore increased by the first and second conductors 235a, 235b.

The conducting sheets 223a-223d and conducting material inside the holes 129 of the transmission line arrangement 205 together form a ground conductor. The transmission line arrangement 205 which is shown in FIGS. 13A-13D therefore includes a signal conductor 121 and a ground conductor. The transmission line arrangement 205 which is shown in FIGS. 13A-13D may extend at least part of the way between a first end of the probe and a second end of the probe. The first end of the probe is adapted for connection to a device under test 1 (not shown in FIGS. 13A-13D). The second end of the probe is adapted for connection to a test apparatus 8 (not shown in FIGS. 13A-13D).

The first end of the probe and the second end of the probe may include components which are not shown in FIGS. 13A-13D. For example the first end of the probe may include a first probe end electrically connected to the signal conductor 121 and a second probe end electrically connected to the ground conductor. The second end of the probe may include a connector (e.g. of the form of the connector 103 shown in FIG. 6). References herein to a transmission line arrangement are not intended to include components such as probe ends and connectors which are adapted for connection to a DUT and/or a test apparatus 8. References herein to a transmission line arrangement are instead intended to refer to the arrangement of a signal conductor and a ground conductor which extend at least part of the way between the first and second ends of a probe. For example, a transmission line arrangement may only be considered to include portions of conductors which are situated in or in contact with an insulating material. Components such as probe ends which may extend out of an insulating material are not considered to form part of the transmission line arrangement. In embodiments in which the transmission line arrangement is formed on a PCB. The transmission line arrangement may only be considered to include portions of the conductors which are formed on the PCB.

The transmission line arrangement 105 which is shown in FIGS. 13A-13D may be considered to comprise a first region 243 situated towards the first end of the probe, a second region 245 situated towards the second end of the probe and a transition region 247 situated in between the first region 243 and the second region 245. In the first region 245 the cross-sectional shape of the signal conductor 221 and the ground conductor remain substantially the same at different distances from the first end of the probe. Similarly, in the second region 247 the cross-sectional shape of the signal conductor 221 and the ground conductor remain substantially the same at different distances from the first end of the probe. The cross-sectional shape of the signal and ground conductors in the first region 245 is different to the cross-sectional shape of the signal and ground conductors in the second region 247. The cross-sectional shape of both the signal and the ground conductors therefore change between the first and second ends of the probe.

The characteristic impedance of a transmission line arrangement depends at least in part on the cross-sectional shapes of signal and ground conductors which make up the transmission line arrangement. Since the first and second regions 245, 247 of the transmission line arrangement 205 have different cross-sectional shapes the characteristic impedances of the first and second regions are therefore different from each other. The characteristic impedance of the first end of the probe may be referred to as a first characteristic impedance and is different to a second characteristic impedance of the second end of the probe.

The first characteristic impedance may, for example, be substantially matched to the characteristic impedance of a device to be tested. The second characteristic impedance may, for example, be substantially matched to the characteristic impedance of a test apparatus 8. Matching the impedance of the transmission line arrangement to both a test apparatus 8 and a device to be tested advantageously reduces any signal reflections which occur at interfaces between the probe and the test apparatus 8 and DUT 1. Additionally or alternatively the cross-sectional shape of the transmission line arrangement 205 may be approximately matched to a geometry of a test apparatus 8 and/or a DUT 1. Approximately matching the geometry of the transmission line arrangement to an object to which the transmission line arrangement is to be connected (e.g. a test apparatus 8 and/or a DUT 1) advantageously reduces any signal reflections which may result from spatial discontinuities which occur at interfaces between the probe and the test apparatus 8 and DUT 1.

The transition region 247 is a region of the transmission line arrangement 205 in which the cross-sectional shapes of both the signal and the ground conductor vary with distance from the first end of the probe. For example, in the transition region 247 the width of the signal conductor increases from a first width 241a of the first part 221a of the signal conductor 221 to a second width 241b of the second part of the signal conductor 221b. The shape of the signal conductor 221 therefore changes in the transition region 247 and a cross-sectional dimension (e.g. the width) of the signal conductor 221 increases with decreasing distance from the first end of the probe, in the transition region 247.

The shape of the ground conductor also changes in the transition region 247. In particular, the width of the first conducting sheet 223a decreases with decreasing distance to the first end of the probe in the transition region 247. The transition region further includes a portion which does not include a first conducting sheet 223a. At the point at which the first conducting sheet 223a ends, the width of the first conducting sheet is relatively small (having decreased with decreasing distance to the first end of the probe in the transition region 247). The size of the spatial discontinuity, which occurs at the end of the first conducting sheet 223a is therefore reduced by first tapering the width of the first conducting sheet 223a before the first conducting sheet 223a ends. This advantageously reduces the size of any signal reflections which may occur in the transition region 247.

The transition region 247 also includes at least a portion in which holes 129 are only position on one side of the signal conductor 221. In particular, the first group of holes 233a ends in the transition region 247 such that holes are only position on one side of the signal conductor 221.

The transition region 247 also includes the beginning of the third and fourth conducting sheets 223c, 223d. The separation between the third and fourth conducting sheets 223c, 223d is smaller than the separation between the first and second conducting sheets 223a, 223b.

The transmission line arrangement 205 in the second region 245 is similar to the transmission line arrangement which was described above with reference to FIGS. 9A and 9B. As was described above, such a transmission line arrangement advantageously transmits a signal with relatively low signal loss and/or dispersion. The transmission line arrangement 205 in the second region 245 therefore has advantageous properties for transmitting a signal. The transmission line arrangement 205 in the second region 245 may additionally have a similar cross-sectional shape and/or characteristic impedance to a connector 103 with which the probe is connected to a test apparatus 8. For example, the connector 103 may have the general form of a coaxial connector and may include a signal conductor substantially surrounded by a ground conductor. The transmission line arrangement 205 in the second region 245 may therefore be suitable for connection to a connector 103 without causing large signal reflections at the interface between the transmission line arrangement 205 and the connector 103.

The first region 243 of the transmission line arrangement 205 may, at the first end of the probe, be electrically connected to one or more probe ends. For example, the signal conductor 221 may be electrically connected to a first probe end and the ground conductor may be electrically connected to a second probe end. It will be appreciated that a ground conductor which substantially surrounds a signal conductor 221 (as in the second region 245) may not be easily connected to a probe end without a large discontinuity in the cross-sectional shape of the ground conductor. For example, the cross-sectional shape may undergo a sudden transition from surrounding the signal conductor 221 to only being situated on one side of the signal conductor 221.

In the transmission line arrangement 205 which is shown in FIGS. 13A-13D the transition region 247 serves to gradually transition the shape of the ground conductor from substantially surrounding the signal conductor 221 (in the second region 245) to only being substantially situated on one side of the signal conductor 221. The ground conductor in the first region 243 of the transmission line arrangement

205 may therefore be connected to a probe end without causing large signal reflections at an interface between the probe end and the ground conductor.

The transition region 247 is configured such that is does not include any large discontinuities in the characteristic impedance of the transmission line arrangement 205 so as to reduce any signal reflections caused by impedance discontinuities. The transition region 247 is further configured to gradually taper the cross-sectional shape of the ground conductor so as to reduce any signal reflections caused by changes in the cross-sectional shape of the ground conductor.

As has been described above the transmission line arrangement 205 of FIGS. 13A-13D includes first and second regions 243, 245 which are advantageously matched to elements to which the transmission line arrangement 205 is to be connected so as to reduce any signal reflections which may occur at interfaces of the transmission line arrangement 205 with other elements. The transmission line arrangement 205 of FIGS. 13A-13D also includes a transition region which gradually transitions the shape and characteristic impedance of the signal and ground conductors so as to reduce any signal reflections which may occur in the transmission line arrangement 205 itself. The transmission line arrangement 205 therefore advantageously allows signals to be transmitted between a DUT 1 and a test apparatus 8 whilst reducing any unwanted signal reflections which may occur along the propagation path of the signal.

It will be appreciated that the transmission line arrangement 205 which is shown in FIGS. 13A-13D may only represent a portion of a transmission line arrangement. For example, the second region 245 of the transmission line arrangement 205 may extend further than is shown in FIGS. 13A-13D. In some embodiments a transmission line arrangement may include more than one transition region. For example, a transmission line arrangement may include a further transition region between the second region 245 and the second end of the probe. The further transition region may transition the cross-sectional shape of the transmission line arrangement from the cross-sectional shape of the second region 245, to substantially match a connector 103 to which the transmission line arrangement is to be connected at its second end.

It should be appreciated that the transition line arrangement which is shown in FIGS. 13A-13D is merely an example of a transmission line arrangement according to an embodiment of the invention. Other embodiments may include different arrangements which bring about the same advantageous effects as the transmission line arrangement of FIGS. 13A-13D.

In some embodiments, a transition line arrangement may include portions of conductors which do not have a substantial effect on the function of the transmission line arrangement. Portions of conductors which do not have a substantial effect on the function of the transmission line arrangement may, for example, be included in order to assist with manufacturing of the transmission line arrangement.

For example, in the arrangement which is shown in FIGS. 13A-13D the fourth conducting sheet 223d is confined to the first region 243 and a small part of the transition region 247. However, in alternative embodiments the fourth conducting sheet 223d may extend along substantially the entire length of the transmission line arrangement 105 in the z-direction. That is, the fourth conducting sheet may extend throughout the transition region 247 and into the second region 245. Such an arrangement may assist manufacturing of the fourth conducting sheet 223d since the fourth conducting sheet need not be confined to a limited region of the transmission line arrangement 205 in the z-direction.

However, it will be appreciated that the above described extension of the fourth conducting sheet 223d in the z-direction will have substantially no effect on the current pathways of ground and signal currents through the transmission line arrangement, within a frequency range of interest. The ground current will continue to pass from the fourth conducting sheet 223d to the second conducting sheet 223b via conducing material inside the hole 233d which joins the second and fourth conducting sheets 223b, 223d. This will be the case even if the fourth conducting sheet extends below the second conducting sheets 223b as described above. An extended fourth conducting sheet 223d may however support propagation of very high frequency components which lie outside of a frequency range of interest.

References herein to a signal and ground conductor are intended to refer to conductors which provide a current pathway and which will in practice transmit signal and ground currents respectively, within a frequency range of interest. In the above described example, in which the fourth conductor 223d extends beyond the hole 233d between the second and fourth conducting sheets 223b, 223d, the portion of the fourth conductor 223d which extends beyond the hole 233d will in practice transmit substantially no current, within a frequency range of interest. This portion of the fourth conductor 223d is not therefore considered to form part of the ground conductor since it will transmit substantially no ground current, within a frequency range of interest. A frequency range of interest may be considered to be a frequency range which a transmission line arrangement is configured to support.

The precise arrangement of a transmission line arrangement according to embodiments of the invention will depend on the geometry and/or the characteristic impedance of elements to which the transmission line arrangement is to be connected. For example, a transmission line arrangement according to an embodiment of the invention may be specifically designed for connection to given elements (e.g. a given test apparatus and a given DUT).

A specifically designed transmission line arrangement may include a first region configured for connection to an element (e.g. a probe end and/or a DUT) at a first end of a probe and a second region configured for connection to another element (e.g. a test apparatus) at a second end of the probe. The transmission line arrangement may further include a transition region in which the cross-sectional shape and/or the characteristic impedance of the transmission line arrangement gradually transitions between the arrangements in the first and second regions. The transmission line arrangement may include further regions. For example, further transition regions may be included in the transmission line arrangement. The first region, the second region and the transition region may take many different forms depending on the properties of a DUT and test apparatus to which the transmission line arrangement is to be connected.

Transmission line arrangements according to embodiments of the invention may be configured to reduce any large discontinuities of the characteristic impedance and/or cross-sectional shape of a transmission line arrangement. As has been described above this may be achieved by providing a signal conductor and a ground conductor having cross-sectional shapes which, for at least part of the length of the transmission line arrangement, gradually change along the length of the transmission line arrangement. In some embodiments the shape of the signal and ground conductors may change as a continuously varying function of distance from one end of the transmission line arrangement.

Figure 14A:
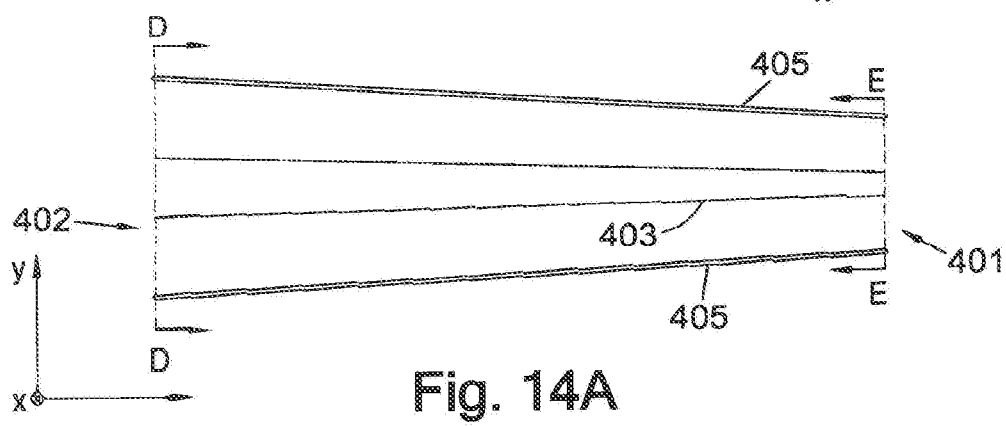

FIGS. 14A, 14B and 14C are schematic illustrations of a transmission line arrangement which may form part of a probe according to an embodiment of the invention. FIG. 14A is a side cross-section through the transmission line arrangement. The cross-section which is shown in FIG. 14A is a cross-section through a plane C-C as indicated in FIGS. 14B and 14C. The transmission line arrangement extends between a first end 401 and a second end 402. FIG. 14B is a cross-section through the second end 402 of the transmission line arrangement. The cross-section of FIG. 14B is taken in a plane D-D which is indicated in FIG. 14A. FIG. 14C is a cross-section through the first end 401 of the transmission line arrangement. The cross-section of FIG. 14C is taken in a plane E-E which is indicated in FIG. 14A.

The transmission line arrangement shown in FIGS. 14A-14C comprises a signal conductor 403 and a ground conductor 405. As can be seen in FIGS. 14B and 14C the signal and ground conductors 205 are arranged in a coaxial arrangement with the ground conductor 405 surrounding the signal conductor 403. The signal and ground conductors 403, 405 are separated from each by an insulating material (not explicitly shown in FIGS. 14A-14C).

As can be seen in FIGS. 14A-14C, the cross-sectional shape of both the signal and ground conductors 403, 405 changes between the first and second ends of the transmission line arrangement 401, 402. In particular, a diameter of $D_1$ of the signal conductor 403 increases with increasing distance from the first end 401 of the transmission line arrangement. Similarly, a diameter $D_2$ of the ground conductor 405 increases with increasing distance from the first end 401 of the transmission line arrangement. That is, the diameters $D_1$, $D_2$ of the signal and ground conductors 403, 405 are both larger at the second end 402 of the transmission line arrangement than at the first end 403 of the transmission line arrangement.

Since the cross-sectional shapes of the signal and ground conductors 403, 405 change between the first and second ends 401, 402 of the transmission line arrangement, the first end of the transmission line arrangement 401 as a first characteristic impedance which is different to a second characteristic impedance at the second end 402 of the transmission line arrangement. The first characteristic impedance may be substantially matched to an element to which the first end 401 is to be connected (e.g. a DUT). The second characteristic impedance may be substantially matched to an element to which the second end 402 is to be connected (e.g. a test apparatus). Additionally or alternatively the cross-sectional shapes of the first and second ends 401, 402 may be substantially matched to the shapes of elements to which the ends are to be connected. As was described above matching the impedance and/or the cross-sectional shape of a transmission line arrangement at its first and second ends to elements to which the transmission line arrangement is to be connected advantageously reduces any signal reflections which may occur at interfaces between the transmission line arrangements and the elements.

In the embodiment shown in FIGS. 14A-14C the cross-sectional shapes of the signal and ground conductors are continuous functions of the distance from the first end 401 of the transmission line arrangement. Consequently, the characteristic impedance of the transmission line arrangement is also a continuous function of the distance from the first end 401 of the transmission line arrangement. Advantageously, this reduces any signal reflections which may occur along the transmission line arrangement.

Whilst the transmission line arrangement which is shown in FIGS. 14A-14C may be particularly effective at reducing any signal reflections which occur along the transmission line arrangement, as was described above, a coaxial transmission line arrangement may be relatively expensive to manufacture. Furthermore, a coaxial transmission line arrangement may not match the shape of an element to which the transmission line arrangement is to be connected at one of its ends. For example, as was described above with reference to FIGS. 13A-13D at a first end of the transmission line, a signal conductor may be connected to a first probe end and a ground conductor may be connected to a second probe end. This may, in particular result in a spatial mismatch between the ground conductor of a coaxial arrangement and the second probe end. Such a mismatch may be a source of substantial signal reflections.

As was described above with reference to FIGS. 13A-13D, embodiments of the type shown in FIGS. 13A-13D may advantageously allow both the shape and the characteristic impedance of a transmission line arrangement to be substantially matched at both ends of the transmission line arrangement to elements to which the transmission line is to be connected. Furthermore, a transmission line arrangement of the type shown in FIGS. 13A-13D may be manufactured relatively cheaply (when compared to, for example, a coaxial arrangement). For example, a transmission line arrangement of the type shown in FIGS. 13A-13D may be manufactured on a PCB.

Some embodiments of a transmission line arrangement have been described above in which a signal conductor and a ground conductor have cross-sectional shapes which, for at least part of the length of the transmission line arrangement, gradually change along the length of the transmission line arrangement. However, some embodiments may include portions in which the cross-sectional shape of a signal and/or a ground conductor undergo step changes. For example, a transmission line may include one or more portions including a quarter-wave impedance transformer type arrangement. Such an arrangement may include discontinuities in the cross-sectional shape of the conductors. Quarter-wave impedance transformers may cause sudden jumps in impedances. However the jumps in impedance may be arranged such that different signal reflections cancel each other out around a specified frequency. A signal can therefore propagate to a portion having a different impedance through the transformer without causing any substantial back reflections.

FIGS. 15A and 15B are schematic illustrations of a portion of a further embodiment of a transmission line arrangement which might form part of a transition region. FIG. 15A shows a side view of the portion of the transmission line arrangement. FIG. 15B shows a top-down view of a portion of a signal conductor which forms part of the transmission line arrangement. As shown in FIG. 15A the transmission line arrangement includes a first conducting sheet 323a, a second conducting sheet 323b, a third conducting sheet 323c and a fourth conducting sheet 323d, which together form a ground conductor. The ground conductor transitions from the first and second conducting sheets 323a, 323b to the third and fourth conducting sheets 323c, 323d in a transition region 347. A signal conductor 321 extends between the conducting sheets 323a-323d. Whilst not explicitly shown in FIG. 15A the conducting sheets 323a-323d are separated from the signal conductor 321 by portions of an insulating material.

The separation between the first and second conducting sheets 323a, 323b is smaller than the separation between the third and fourth conducting sheets 323c, 323d. A height of the ground conductor is therefore expanded in the transition region 347. The conducting sheets are electrically connected by holes 329 in an insulating material. The holes 329 include conducting material inside the holes which provides conducting pathways between the first and third conducting sheets 323a, 323c and between the second and fourth conducting sheets 323b, 323d respectively.

As was described above a height of the ground conductor is expanded in the transition region 347. Since the characteristic impedance is at least in part dependent on the cross-sectional shape of the transmission line arrangement, a sudden expansion in the height of the ground conductor may lead to a sudden change in the characteristic impedance of the transmission line arrangement. In order to reduce the size of any change in the characteristic impedance, a width of the signal conductor 321 also changes in the transition region 347. As is shown in FIG. 3B the width of the signal conductor gradually reduces and then undergoes a step increase at the same z-position as the position at which the height of the ground conductor increases. The step increase in the width of the signal conductor serves to counteract the change in characteristic impedance which results from the step increase in the height of the ground conductor. The arrangement which is shown in FIGS. 15A and 15B is thus configured to include no large discontinuity in the characteristic impedance of the transmission line arrangement. That is the transition region is configured such that changes in the characteristic impedance of the transmission line arrangement are substantially continuous.

The arrangement which is shown in FIGS. 15A and 15B is merely a further example of a transition region in which a cross-sectional shape of both a signal and ground conductor changes and which is configured to not include any large discontinuities in the characteristic impedance of the transmission line arrangement. That is, the transition region is configured such that changes in the characteristic impedance of the transmission line arrangement are substantially continuous. In the transition region 347 which is shown in FIGS. 15A and 15B, the signal conductor has a first cross-sectional dimension (the width of the signal conductor) and the ground conductor has a second cross-sectional dimension (the height of the ground conductor). Both the first and second dimensions increase in the transition region at substantially the same z-position. This allows dimensions of the conductors to be discontinuously changed whilst ensuring that any changes in the characteristic impedance are substantially continuous.

Embodiments have been described above in the context of electrically connecting a signal conductor to a first probe end and a ground conductor to a second probe end. However, in some embodiments a probe may comprise more than two probe ends. For example, a probe may comprise three probe ends. A probe comprising three probe ends may comprise one probe end connected to the signal conductor and two probe ends which are each connected to the ground conductor. Such a configuration may be referred to as a ground-signal-ground probe configuration.

Embodiments have been described above in which a conducting pathway between conducting sheets is provided by a plurality of holes in an insulating material wherein conducting material is situated in the holes. In some embodiments, other forms of conducting pathways between conducting sheets may be provided. For example, pieces of conducting material may be provided on one or more sides of an insulating material and may provide conducting pathways between conducting sheets. In general any arrangement of pieces of conducting material may be used which provides conducting pathways between conducting sheets.

Figure 16:
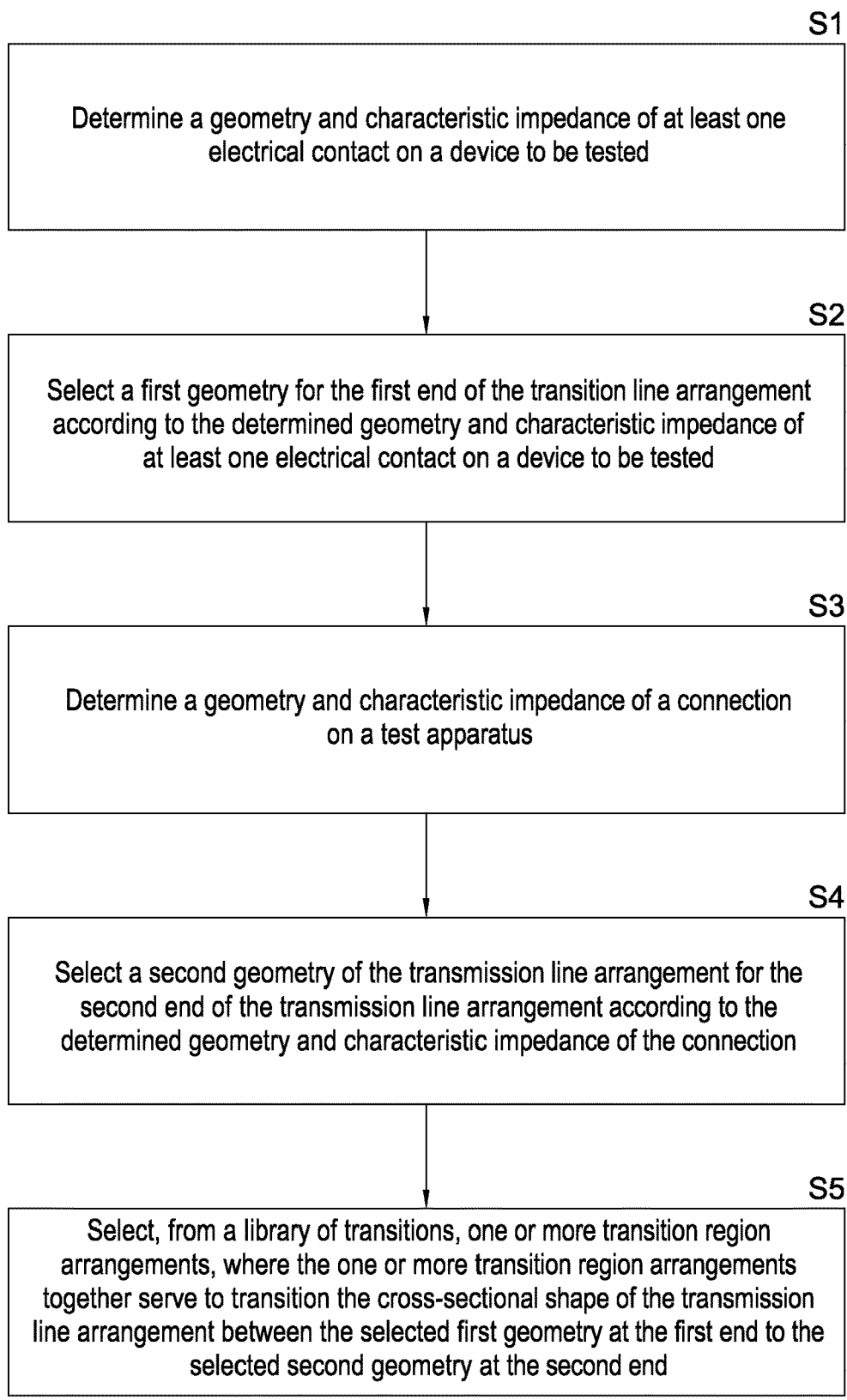
FIG. 16 is a flow chart of a method according to the embodiment of the invention.

FIG. 16 is a flow chart representing a method of designing a probe according to an embodiment of the invention. At step S1 of the method a geometry and characteristic impedance of at least one electrical contact on a device to be tested is determined. Step S1 may, for example, comprise measuring the geometry of at least one electrical contact on a device to be tested. For example, an optical scanner may be used to determine the geometry of an electrical contact. Alternatively the geometry may be obtained from design data related to the device under test.

Determining the characteristic impedance of at least one electrical connection on a device to be tested may comprise measuring the characteristic impedance of an electrical contact. For example, a standard probe of known impedance may be used to connect a test apparatus to an electrical contact. A signal pulse may be transmitted into the electrical contact via the probe and signal reflections and/or transmissions may be measured by the test apparatus. Measured signal reflections and/or transmissions may be used to determine the characteristic impedance of the electrical contact. Alternatively, the characteristic impedance of at least one electrical contact may be obtained from design data related to the device under test.

At step S2 of the method a first geometry for a first end of a transmission line arrangement is selected according to the determined geometry and characteristic impedance of the at least one electrical contact on a device to be tested.

The first geometry may, for example, be selected to have a characteristic impedance which substantially matches the characteristic impedance of the at least one electrical contact. Additionally or alternatively the first geometry may be selected to approximately match the geometry of one or more probe ends via which the transmission line is to be connected to the electrical contact.

At step S3 a geometry and characteristic impedance of a connection on a test apparatus is determined. The geometry and/or the characteristic impedance of the connection may, for example, be obtained from design data or may be measured.

At step S4 a second geometry for a second end of a transmission line arrangement is selected according to the determined geometry and characteristic impedance of the connection on the test apparatus. The second geometry may, for example, be selected to have a characteristic impedance which substantially matches the characteristic impedance of the connection. Additionally or alternatively the second geometry may be selected to approximately match the geometry of the connection.

At step S5 one or more transition regions are selected from a library of transition region arrangements. The one or more selected transition regions together serve to transition the cross-sectional shape of the transmission line arrangement between the selected first geometry at the first end to the selected second geometry at the second end.

The library of transition regions may comprise transition regions having one or more properties of any of the transmission line arrangements described above. Likewise the first and second geometries may have one or more properties of any of the transmission line arrangements described above. The designed transmission line arrangement may be formed in and/or on an insulating material (as was described above). The method may further comprise selecting an insulating material suitable for use in the transmission line arrangement.

As was described above the transmission line arrangement may be formed on a PCB. PCB manufacturing techniques may allow a large variety of different transmission line arrangements to be easily manufactured. PCB manufacturing techniques may therefore advantageously allow a customised transmission line arrangement to be designed and manufactured. Furthermore the cost of PCB manufacturing techniques may allow a customised transmission line arrangement to be manufactured at a relatively low cost.

Whilst embodiments of the invention have been described above in relation to transmission line arrangements formed on a PCB, it will be appreciated that some embodiments may not be formed on a PCB. Some embodiments may include insulating materials other than PCB materials. Some embodiments may be manufactured using manufacturing techniques other than PCB manufacturing techniques.

Various inventive aspects of a probe have been described above and are shown in the figures in the context of specific embodiments of the invention. It will be appreciated that any of the described and/or illustrated aspects may be combined in a single embodiment. For example, one or more features of one embodiment may be combined with one or more features of another embodiment. It will further be appreciated that whilst some embodiments have been described that include more than one inventive aspect, embodiments that comprise only a single inventive aspect are also contemplated herein. In general any of the features of any of the described embodiments may be used in isolation or may be used in any combination with any of the other features of the described embodiments.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A transmission line arrangement having a first end and a second end, the transmission line arrangement being configured to transmit a signal between the first end and the second end, the transmission line arrangement comprising:
   a signal conductor extending between the first end and the second end of the transmission line arrangement;
   a first conducting sheet and a second conducting sheet positioned on two opposing sides of the signal conductor;
   an insulating material separating the first and second conducting sheets from the signal conductor; and
   a plurality of pieces of conducting material extending between the first and second conducting sheets and arranged at different positions between the first and second ends of the transmission line arrangement, wherein the pieces of conducting material and the conducting sheets are arranged to substantially surround the signal conductor for at least part of its length between the first and second ends of the transmission line arrangement;
   wherein the resonant frequency of antennas formed by the pieces of conducting material is greater than 30 GHz.

2. The transmission line arrangement of claim 1, further comprising a conductor extending between at least two of the plurality of pieces of conducting material, wherein the conductor intersects the pieces of conducting material in between the first and second conducting sheets.

3. The transmission line arrangement of claim 2, comprising a plurality of conductors, each conductor extending between at least two of the pieces of conducting material and intersecting the pieces of conducting material in between the first and second conducting sheets, wherein different conductors intersect the pieces of conducting material at different distances from the first conducting sheet.

4. The transmission line arrangement of claim 2, wherein the plurality of pieces of conducting material comprises a first group of pieces of conducting material positioned on a first side of the signal conductor and a second group of pieces of conducting material positioned on a second side of the signal conductor, the second side being substantially opposite the first side.

5. The transmission line arrangement of claim 4, wherein the transmission line arrangement comprises a first conductor extending between pieces of conducting material of the first group of pieces of conducting material and a second conductor extending between pieces of conducting material of the second group of pieces of conducting material.

6. The transmission line arrangement of claim 4 wherein the first group of pieces of conducting material and/or the second group of pieces of conducting material are arranged substantially in a line.

7. The transmission line arrangement of claim 6, wherein the line of pieces of conducting material extends substantially parallel to a direction in which the signal conductor extends.

8. The transmission line arrangement of claim 1, wherein the first and second sheets lie substantially in first and second planes, the first and second planes both being substantially perpendicular to a direction in which the plurality of pieces of conducting material extend.

9. The transmission line arrangement of claim 1, further comprising a plurality of holes in the insulating material and extending between the first and second conducting sheets, wherein at least some of the plurality of pieces of conducting material are situated in at least some of the plurality of holes.

10. The transmission line arrangement of claim 1, wherein the transmission line arrangement is formed on a printed circuit board.

11. A probe suitable for use in testing a device, the probe comprising:
    a first end adapted for connection to a device under test;
    a second end adapted for connection to a test apparatus; and
    a transmission line arrangement according to claim 1, wherein the transmission line arrangement is configured to transmit a signal between the first end of the probe and the second end of the probe.

12. A test system for testing a device, the test system comprising:
    a source of pulsed radiation configured to provide a generating radiation beam and a receiving radiation beam, wherein the generating and receiving radiation beams are pulsed radiation beams;
    a first signal conversion device arranged to receive a pulse of the generating radiation beam and configured to output a signal pulse in response to receiving a pulse of the generating radiation beam;
    a second signal conversion device arranged to receive a pulse of the receiving radiation beam and configured to sample a signal pulse in response to receiving a pulse of the receiving radiation beam; and
    a probe according to claim 11, the probe being configured to transmit a signal pulse from the first signal conversion device to the device under test and configured to transmit a signal pulse reflected from or transmitted by the device under test to the second signal conversion device.

13. A probe suitable for use in testing a device, the probe comprising:
a first end adapted for connection to a device under test;
a second end adapted for connection to a test apparatus; and
a transmission line arrangement extending at least part of the way between the first and second ends of the probe, wherein the transmission line arrangement has a first characteristic impedance at a first end of the transmission line arrangement and a second characteristic impedance at a second end of the transmission line arrangement, wherein the second characteristic impedance is different to the first characteristic impedance, the transmission line arrangement comprising:
a signal conductor configured to transmit a signal current between the first and second ends of the transmission line arrangement, wherein a cross-sectional shape of the signal conductor changes between the first and the second ends of the transmission line arrangement; and
a ground conductor configured to transmit a ground current between the first and second ends of the transmission line arrangement, wherein a cross-sectional shape of the ground conductor changes between the first and second ends of the transmission line arrangement.

14. The probe of claim 13, wherein the cross-sectional shapes of the signal and ground conductors at the first end of the transmission line arrangement are configured such that the first characteristic impedance is substantially matched to the characteristic impedance of the device under test.

15. The probe of claim 13, wherein the cross-sectional shapes of the signal and ground conductors at the second end of the transmission line arrangement are configured such that the second characteristic impedance is substantially matched to the characteristic impedance of the test apparatus.

16. The probe of claim 13, wherein the cross-sectional shapes of the signal and ground conductors at the first end of the transmission line arrangement are configured such that a cross-sectional shape of the transmission line arrangement is substantially matched to the cross-sectional shape of at least one electrical contact of the device under test.

17. The probe of claim 13, wherein the cross-sectional shapes of the signal and ground conductors at the second end of the transmission line arrangement are configured such that a cross-sectional shape of the transmission line arrangement is substantially matched to the cross-sectional shape of a connection of the test apparatus.

18. The probe of claim 13, wherein the transmission line arrangement includes at least one transition region in which the cross-sectional shapes of the signal and/or the ground conductor vary with distance from the first end of the probe.

19. The probe of claim 18, wherein the transition region is configured such that changes in the characteristic impedance of the transmission line arrangement with changing distance from the first end of the probe are substantially continuous.

20. The probe of claim 18, wherein the transition region is configured such that changes in the cross-sectional shape of the transmission line arrangement with changing distance from the first end of the probe are substantially continuous.

* * * * *